(12) United States Patent
Okamoto

(10) Patent No.: US 8,633,466 B2
(45) Date of Patent: Jan. 21, 2014

(54) COMPOUND SEMICONDUCTOR DEVICE, METHOD FOR PRODUCING THE SAME, AND POWER SUPPLY

(75) Inventor: Naoya Okamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 58 days.

(21) Appl. No.: 13/371,823

(22) Filed: Feb. 13, 2012

(65) Prior Publication Data

US 2012/0218796 A1 Aug. 30, 2012

(30) Foreign Application Priority Data

Feb. 25, 2011 (JP) ................................. 2011-040507

(51) Int. Cl.
*H01L 29/06* (2006.01)

(52) U.S. Cl.
USPC ... 257/12; 257/200; 257/E29.081; 257/E21.09; 438/478; 363/126

(58) Field of Classification Search
USPC ..................... 257/12, 200, E29.081, E21.09; 438/478; 363/126
See application file for complete search history.

(56) References Cited

U.S. PATENT DOCUMENTS

| | | | | |
|---|---|---|---|---|
| 4,903,091 A | * | 2/1990 | Baba et al. | 257/194 |
| 2013/0126942 A1 | * | 5/2013 | Nakajima et al. | 257/192 |

OTHER PUBLICATIONS

W. Tantraporn, et al.; "Multiple-Zone Single-Mask Junction Termination Extension—A High-Yield Near-Ideal Breakdown Voltage Technology;" IEEE Transactions on Electron Devices; vol. ED-34; No. 10; Oct. 1987; pp. 2200-2210.

H. Yilmaz, et al.; "Optimizaton and Surface Charge Sensitivity of High-Voltage Blocking Structures with Shallow Junctions;" IEEE Transactions on Electron Devices; vol. 38; No. 7; Jul. 1991; pp. 1666-1675.

R. Perez, et al.; "Planar Edge Termination Design and Technology Considerations for 1.7-kV 4H-SiC PiN Diodes;" IEEE Transactions on Electron Devices; vol. 52; No. 10; Oct. 2005; pp. 2309-2316.

H. Lee, et al; "1200-V 5.2-mΩ-cm2 4H-SiC BJTs With a High Common-Emitter Current Gain;" IEEE Electron Device Letters; vol. 28; No. 11; Nov. 2007; pp. 1007-1009.

H. Lee, et al.; "High-Current-Gain SiC BJTs With Regrown Extrinsic Base and Etched JTE;" IEEE Transactions on Electron Devices; vol. 55; No. 8; Aug. 2008; pp. 1894-1898.

A. Bolotnikov, et al.; "Junction Termination Extension Implementing Drive-in Diffusion of Boron for High-Voltage SiC Devices;" IEEE Transactions on Electron Devices; vol. 57; No. 8; Aug. 2010; pp. 1930-1935.

O. Ambacher, et al.; "Two-dimensional electron gases induced by spontaneous and piezoelectic polarization charges in N- and Ga-face AlGaN/GaN heterostructures;" Journal of Applied Physics; vol. 85; No. 6; Mar. 15, 1999; pp. 3222-3233.

M. Wong, et al.; "Polarity inversion of N-face GaN by plasma-assisted molecular beam epitaxy;" Journal of Applied Physics 104; Nov. 12, 2008; pp. 093710-1-093710-6 and cover sheet (7 sheets total).

* cited by examiner

*Primary Examiner* — Jami M Valentine
(74) *Attorney, Agent, or Firm* — Kratz, Quintos & Hanson, LLP

(57) ABSTRACT

A compound semiconductor device includes: a substrate; a first compound semiconductor layer formed over the substrate; a second compound semiconductor layer formed over the first compound semiconductor layer; and an upper electrode formed over the first compound semiconductor layer, wherein two-dimensional hole gas is generated in a region of the first compound semiconductor layer, the region being located at an interface between the first compound semiconductor layer and the second compound semiconductor layer, so as to have a hole concentration that decreases with increasing distance from the upper electrode.

14 Claims, 28 Drawing Sheets

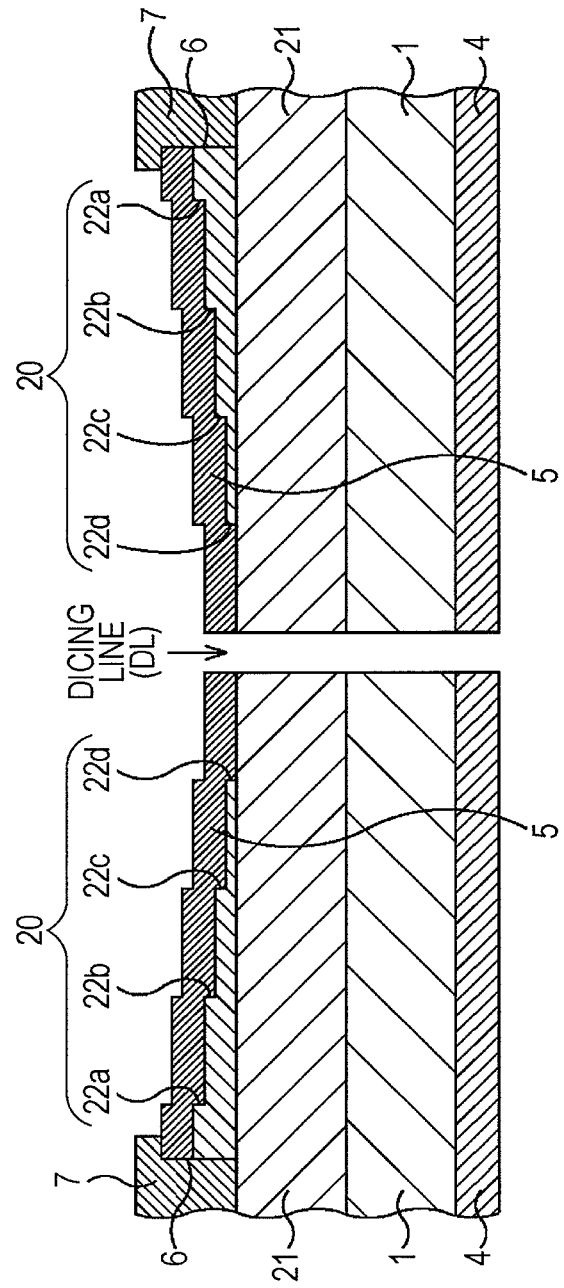

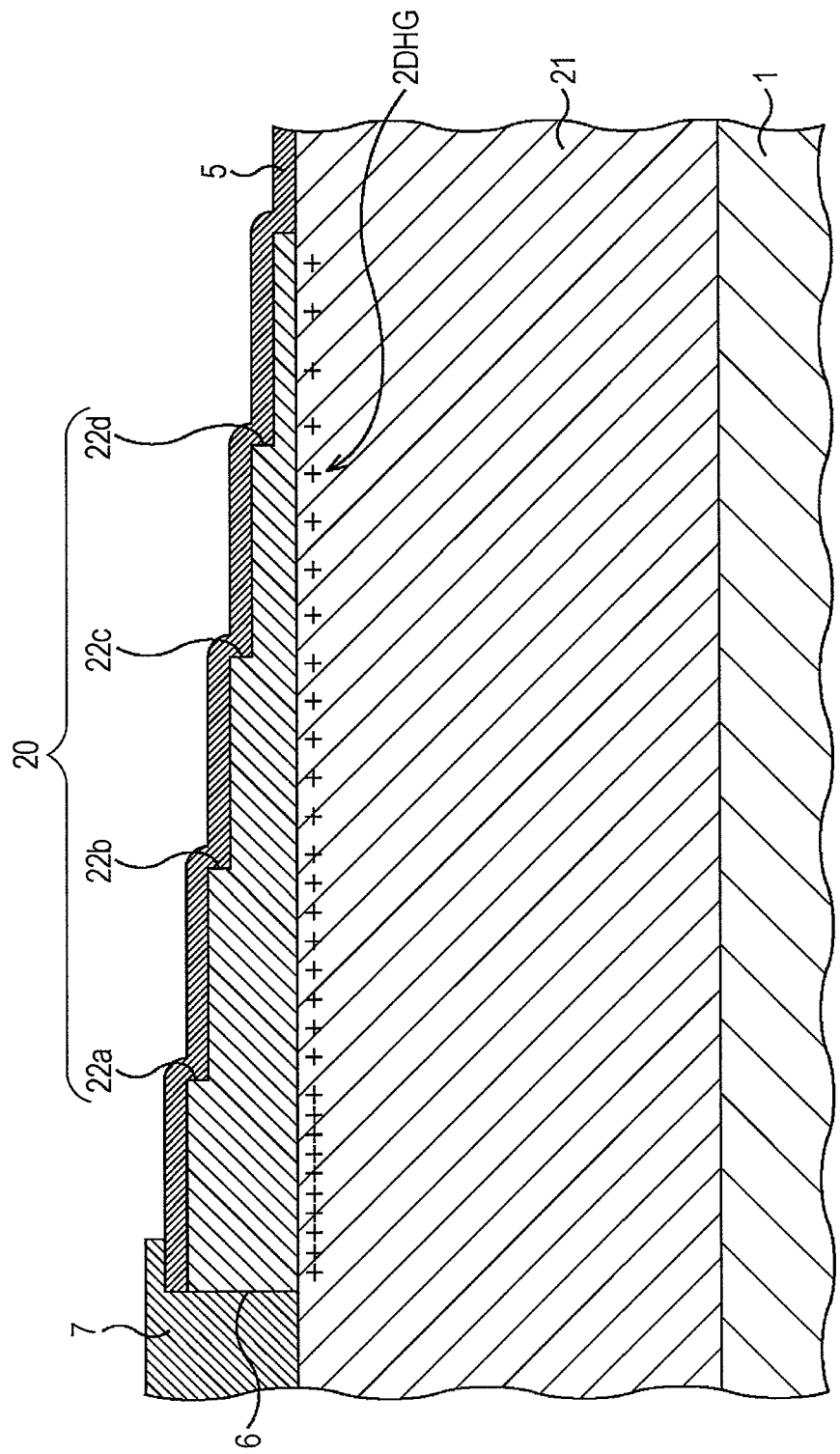

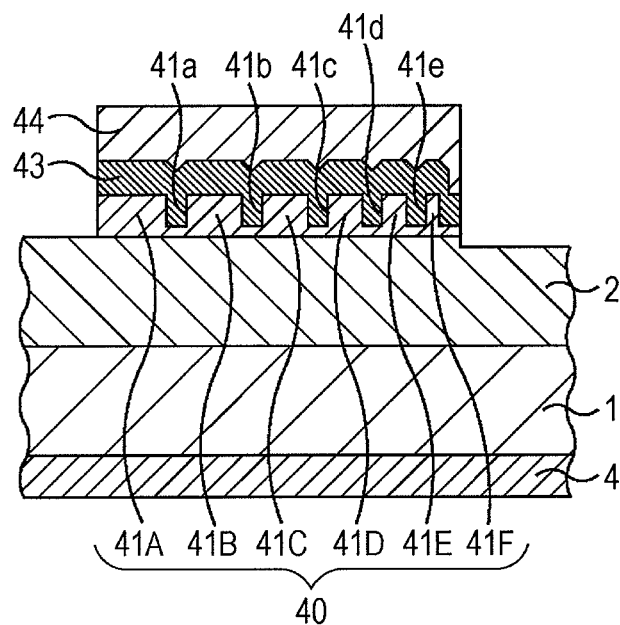
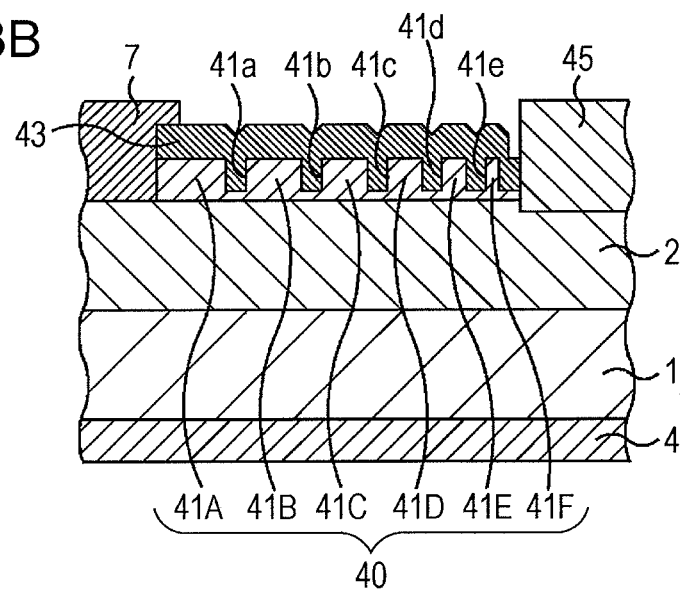

COMPOUND SEMICONDUCTOR DEVICE, METHOD FOR PRODUCING THE SAME, AND POWER SUPPLY

CROSS-REFERENCE TO RELATED APPLICATION

The present invention contains subject matter related to Japanese Patent Application No. 2011-40507 filed in the Japan Patent Office on Feb. 25, 2011, the entire contents of which are incorporated herein by reference.

FIELD

The embodiments discussed herein are related to a compound semiconductor device, a method for producing the compound semiconductor device, and a power supply.

BACKGROUND

Nitride semiconductor devices have physical properties suitable as high-breakdown-voltage high-speed electronic devices and are expected to be applied to, for example, server systems. There are high-breakdown-voltage semiconductor devices including substrates composed of, for example, silicon (Si) and silicon carbide (SiC), which are called vertical nitride semiconductor devices. Such a vertical nitride semiconductor device includes a p-type semiconductor region formed in the surface of the semiconductor layer by ion implantation of p-type impurities for the purpose of suppressing a decrease in the reverse breakdown voltage due to electric field concentration in a region of the semiconductor layer, the region being located at the interface between the semiconductor layer and the insulation layer, and increasing the surge current capacity. The p-type semiconductor region is called a junction termination extension (JTE) structure.

Examples of existing JTE structures include a multizone structure and a guard ring structure. The multizone structure is formed by ion implantation of p-type impurities into a compound semiconductor layer such that the concentration of the p-type impurities gradually decreases from the active area toward the dicing area. The guard ring structure is formed by ion implantation of p-type impurities into a compound semiconductor layer such that the implantation interval of the p-type impurities is changed from the active area toward the dicing area. JTE structures are thus formed by ion implantation of p-type impurities to gradually reduce electric field concentration.

The followings are reference documents.
[Document 1] Tantraporn et al., *IEEE Tran.* ED34, 2200, 1987
[Document 2] Yilmaz, *IEEE Tran.* ED38, 1666, 1991
[Document 3] Pérez et al., *IEEE Tran.* ED52, 2309, 2005
[Document 4] Lee et al., *IEEE EDL*, 28, 1007, 2007
[Document 5] Lee et al., *IEEE Tran.* ED55, 1894, 2008
[Document 6] Bolotnikov et al., *IEEE Tran.* ED57, 1930, 2010
[Document 7] O. Ambacher et al., *J. Appl. Phys.* Vol. 85, 3222, 1999
[Document 8] M. H. Wong et al., *J. Appl. Phys.* Vol 04, 093710, 2008

SUMMARY

According to an aspect of the embodiment, a compound semiconductor device includes a substrate; a first compound semiconductor layer formed over the substrate; a second compound semiconductor layer formed over the first compound semiconductor layer; and an upper electrode formed over the first compound semiconductor layer, wherein two-dimensional hole gas is generated in a region of the first compound semiconductor layer, the region being located at an interface between the first compound semiconductor layer and the second compound semiconductor layer, so as to have a hole concentration that decreases with increasing distance from the upper electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 10 is a schematic sectional view illustrating a step (subsequent to the step in FIG. 9) of a method for producing a SBD according to the first modification of the first embodiment;

FIG. 11 is a schematic sectional view illustrating generation of 2DHG in a SBD according to the first modification of the first embodiment;

FIGS. 23A and 23B are schematic sectional views sequentially illustrating steps (subsequent to the step in FIG. 22C) of a method for producing a SBD according to the third embodiment;

DESCRIPTION OF EMBODIMENTS

Figure 1A:
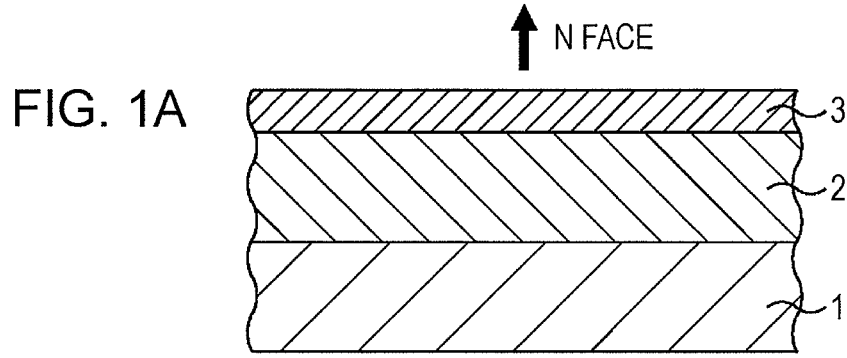
FIGS. 1A to 1C are schematic sectional views sequentially illustrating steps of a method for producing a SBD according to a first embodiment.

Hereinafter, embodiments will be described in detail with reference to the drawings. The embodiments below disclose compound semiconductor devices having a JTE structure and the configurations and production methods of the devices will be described.

In the drawings, components are not necessarily drawn to scale for clarity.

First Embodiment

The first embodiment discloses a Schottky barrier diode (SBD) as a compound semiconductor device having a JTE structure.

FIGS. 1A to 5 are schematic sectional views sequentially illustrating the steps of a method for producing a SBD according to the first embodiment.

Referring to FIG. 1A, an n-GaN layer 2 and an AlGaN layer 3 are sequentially formed on a surface of an n-GaN substrate 1. Specifically, for example, the n-GaN substrate 1 is used as a growth substrate. The n-GaN substrate 1 contains n-type impurities such as Si at a predetermined concentration (for example, about $1\times10^{18}/cm^3$).

The n-GaN layer 2 and the AlGaN layer 3 are sequentially grown on a surface of the n-GaN substrate 1 (herein, (000-1) face, that is, N face) by, for example, metal organic chemical vapor deposition (MOCVD). The n-GaN layer 2 is formed so as to have an N-face surface; have a thickness of, for example, about 5 µm; and contain n-type impurities such as Si at a concentration of about $1\times10^{16}/cm^3$. The AlGaN layer 3 is formed on the N face of the n-GaN layer 2 so as to have an Al content of, for example, about 10% and a thickness of, for example, about 20 nm. Instead of MOCVD, for example, molecular beam epitaxy (MBE) may be used.

GaN and AlGaN are grown with source gases that are gas mixtures of trimethylaluminum (TMA) gas, trimethylgallium (TMG) gas, and ammonia ($NH_3$) gas. Depending on a compound semiconductor layer to be grown, the flow rates (one of which may be zero) of the TMA gas serving as an Al source and the TMG gas serving as a Ga source are appropriately determined. The flow rate of the $NH_3$ gas used in the growth of GaN and AlGaN is set at about 100 ccm to 10 LM. The growth pressure is set at about 50 to 300 Torr. The growth temperature is set at about 1000° C. to 1200° C.; in the first embodiment, at about 1000° C.

When n-type GaN is grown, for example, $SiH_4$ gas containing Si serving as n-type impurities at a predetermined flow rate is mixed with the source gas so that GaN is doped with Si.

Alternatively, instead of forming the AlGaN layer 3, an InAlN layer or an InAlGaN layer may be formed on the n-GaN layer 2. When an InAlN layer is grown by, for example, MOCVD or MBE, a source gas that is a gas mixture of trimethylindium (TMI) gas serving as an In source, TMA gas serving as an Al source, and $NH_3$ gas is used. When an InAlGaN layer is grown by, for example, MOCVD, a source gas that is a gas mixture of TMI gas serving as an In source, TMA gas serving as an Al source, TMG gas serving as a Ga source, and $NH_3$ gas is used. Alternatively, an InAlGaN layer may be grown by, for example, MBE.

Instead of forming the n-GaN layer 2, an n-AlGaN layer may be formed on a surface of the n-GaN substrate 1. In such a case, the Al content of the n-AlGaN layer is preferably made higher than that of the AlGaN layer 3 formed on the n-AlGaN layer. When the Al content of the AlGaN layer 3 is about 10%, the Al content of the n-AlGaN layer may be, for example, about 20%.

Figure 1B:
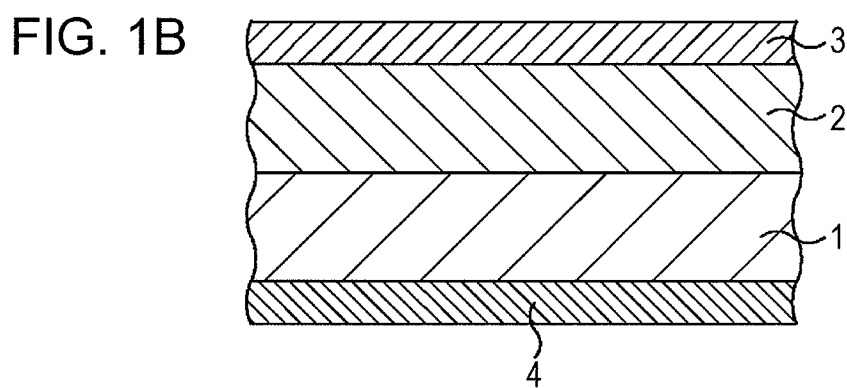

Referring to FIG. 1B, a cathode 4 is subsequently formed on the back surface of the n-GaN substrate 1. Specifically, electrode materials (for example, Ti and Al) are deposited onto the entire back surface of the n-GaN substrate 1 by, for example, vacuum deposition such that a Ti film having a thickness of about 30 nm and an Al film having a thickness of about 300 nm are formed. The deposited Ti and Al films are subjected to rapid thermal annealing (RTA) at, for example, about 600° C. Thus, the cathode 4 covering the back surface of the n-GaN substrate 1 is formed.

Figure 1C:
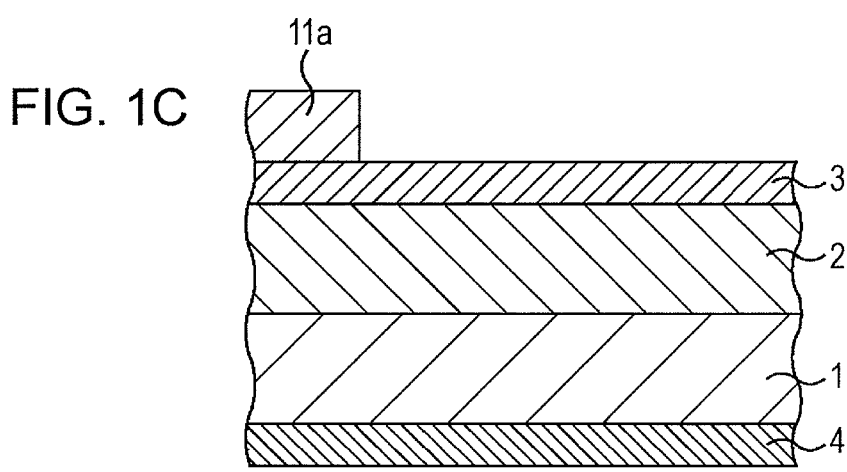

Referring to FIG. 1C, a resist pattern 11a is subsequently formed in an active area on the AlGaN layer 3. Specifically, resist is applied to the AlGaN layer 3 and the applied resist is patterned by lithography such that the resist remains in the active area on the AlGaN layer 3. Thus, the resist pattern 11a is formed.

Figure 2A:
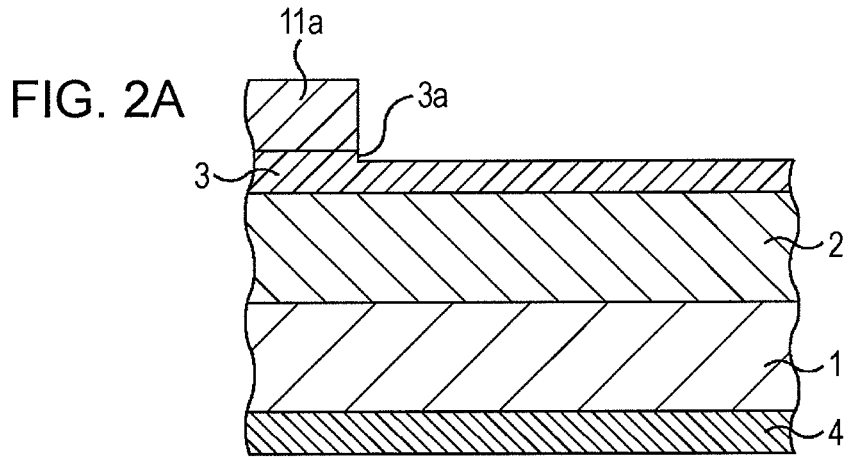
FIGS. 2A to 2C are schematic sectional views sequentially illustrating steps (subsequent to the step in FIG. 1C) of a method for producing a SBD according to the first embodiment.

Referring to FIG. 2A, the AlGaN layer 3 is subsequently etched to form a first stepped portion 3a. Specifically, the AlGaN layer 3 is dry-etched through the resist pattern 11a serving as a mask to a predetermined depth, for example, about 5 nm with an etching gas such as a chlorine-based gas. The AlGaN layer 3 is etched at a rate of, for example, about 10 nm/min. Thus, in the AlGaN layer 3, the first stepped portion 3a is formed so as to have a height of about 5 nm with reference to the etched surface and a width of, for example, about 10 µm.

The resist pattern 11a is removed by, for example, ashing with oxygen plasma.

Figure 2B:
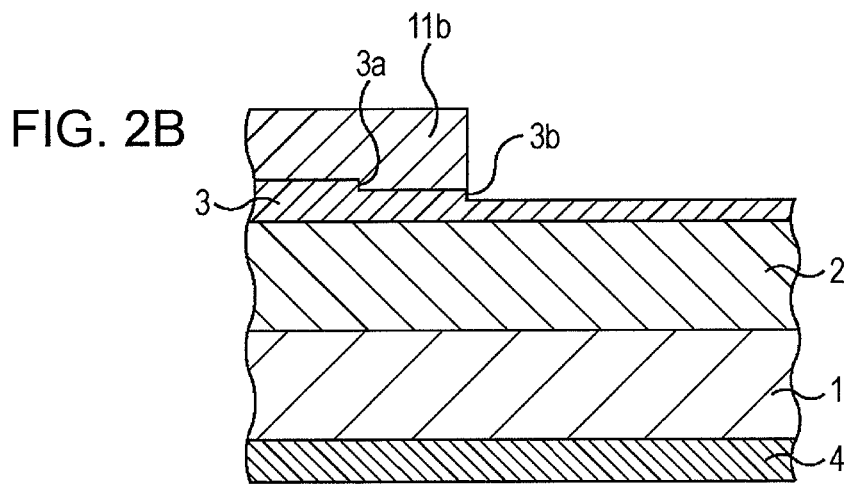

Referring to FIG. 2B, a second stepped portion 3b is subsequently formed in the AlGaN layer 3. Specifically, resist is applied to the AlGaN layer 3 and the applied resist is patterned by lithography such that the resist remains in a predetermined area including the first stepped portion 3a in the AlGaN layer 3. Thus, a resist pattern 11b is formed.

The AlGaN layer 3 is dry-etched through the resist pattern 11b serving as a mask to a predetermined depth, for example, about 5 nm with an etching gas such as a chlorine-based gas. Thus, in the AlGaN layer 3, the second stepped portion 3b is formed so as to have a height of about 5 nm with reference to the etched surface and a width of, for example, about 10 μm.

The resist pattern 11b is removed by, for example, ashing with oxygen plasma.

Figure 2C:
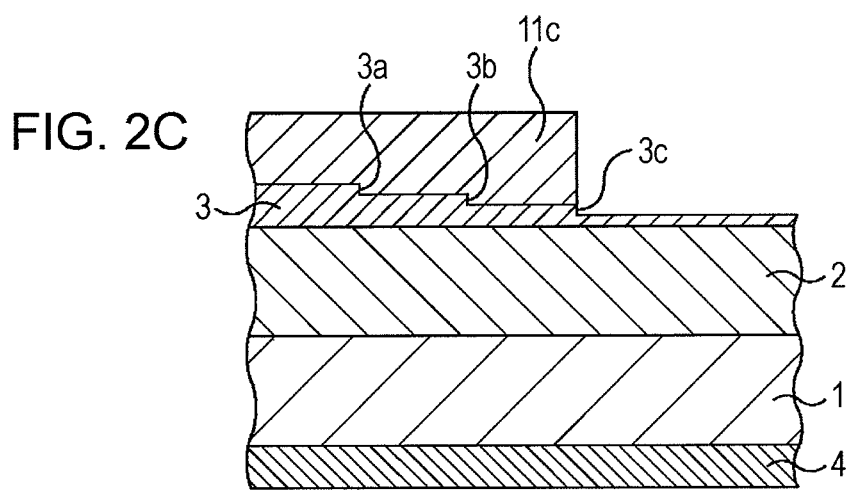

Referring to FIG. 2C, a third stepped portion 3c is subsequently formed in the AlGaN layer 3. Specifically, resist is applied to the AlGaN layer 3 and the applied resist is patterned by lithography such that the resist remains in a predetermined area including the first stepped portion 3a and the second stepped portion 3b in the AlGaN layer 3. Thus, a resist pattern 11c is formed.

The AlGaN layer 3 is dry-etched through the resist pattern 11c serving as a mask to a predetermined depth, for example, about 5 nm with an etching gas such as a chlorine-based gas. Thus, in the AlGaN layer 3, the third stepped portion 3c is formed so as to have a height of about 5 nm with reference to the etched surface and a width of, for example, about 10

The resist pattern 11c is removed by, for example, ashing with oxygen plasma.

Figure 3A:
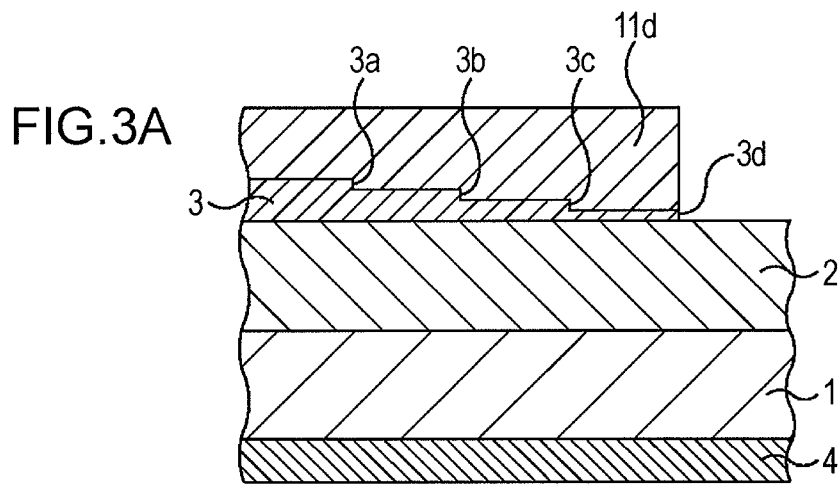
FIGS. 3A to 3C are schematic sectional views sequentially illustrating steps (subsequent to the step in FIG. 2C) of a method for producing a SBD according to the first embodiment.

Referring to FIG. 3A, a fourth stepped portion 3d is subsequently formed in the AlGaN layer 3. Specifically, resist is applied to the AlGaN layer 3 and the applied resist is patterned by lithography such that the resist remains in a predetermined area including the first stepped portion 3a, the second stepped portion 3b, and the third stepped portion 3c in the AlGaN layer 3. Thus, a resist pattern 11d is formed.

The AlGaN layer 3 is dry-etched through the resist pattern 11d serving as a mask with an etching gas such as a chlorine-based gas until the surface of the n-GaN layer 2 is exposed. Thus, in the AlGaN layer 3, the fourth stepped portion 3d is formed so as to have a height of about 5 nm with reference to the etched surface that is the surface of the n-GaN layer 2 and a width of, for example, about 10 μm.

The resist pattern 11d is removed by, for example, ashing with oxygen plasma.

Thus, the AlGaN layer 3 is processed so as to have, on the n-GaN layer 2, a stepped structure whose thickness decreases stepwise from the first stepped portion 3a, the second stepped portion 3b, the third stepped portion 3c, to the fourth stepped portion 3d. Although the AlGaN layer 3 is etched to a depth of 5 nm four times in the first embodiment, the number of times etching is performed and the etching depth may be freely determined.

Figure 3B:
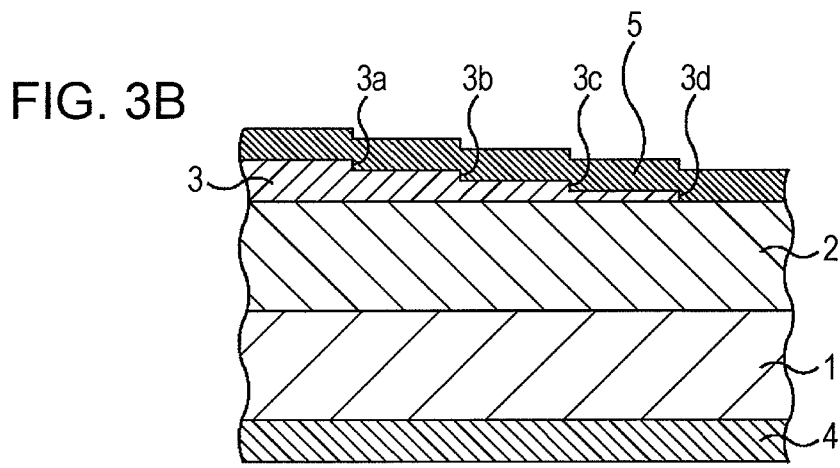

Referring to FIG. 3B, a passivation film 5 is subsequently formed. Specifically, an insulating substance such as SiN is deposited on the n-GaN layer 2 by plasma CVD so as to form a film covering the AlGaN layer 3 and having a thickness of about 400 nm. Thus, the passivation film 5 covering the AlGaN layer 3 is formed.

Figure 3C:
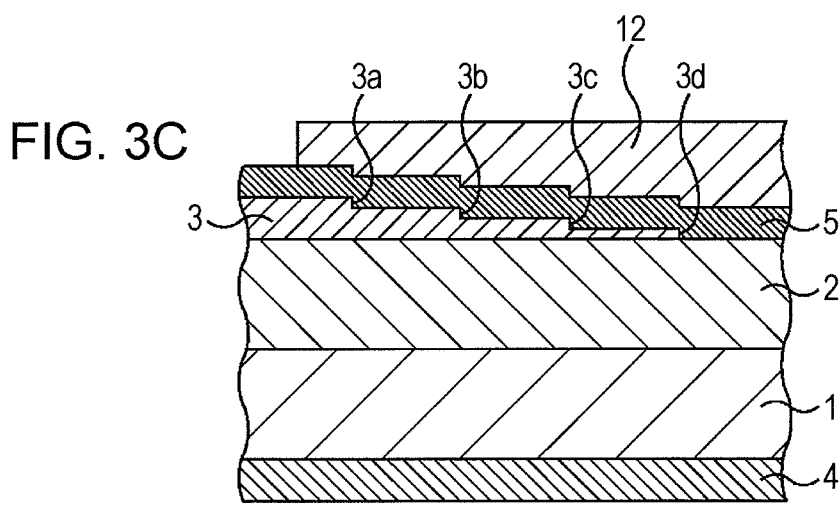

Referring to FIG. 3C, a resist pattern 12 is subsequently formed. Specifically, resist is applied to the passivation film 5 and the applied resist is patterned by lithography so as to form an opening through which a region where an anode is to be formed in the active area on the passivation film 5 is exposed. Thus, the resist pattern 12 is formed.

Figure 4A:
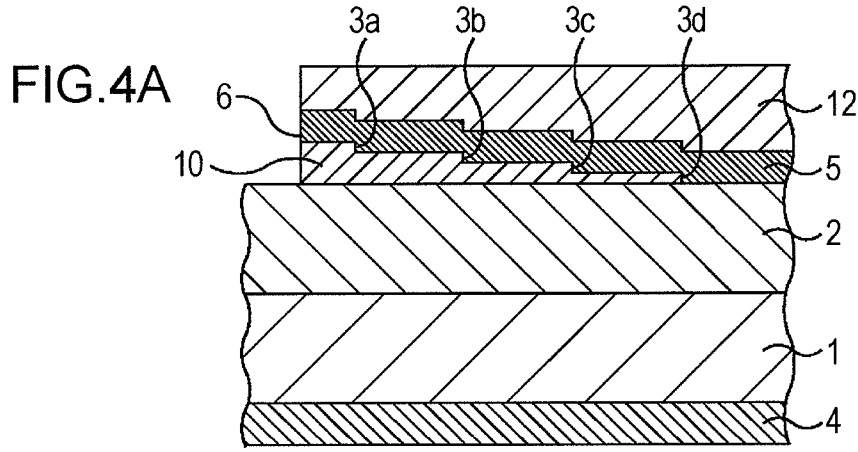
FIGS. 4A to 4C are schematic sectional views sequentially illustrating steps (subsequent to the step in FIG. 3C) of a method for producing a SBD according to the first embodiment.

Referring to FIG. 4A, an opening 6 in which the anode is to be formed is formed so as to extend through the AlGaN layer 3 and the passivation film 5. Specifically, the passivation film 5 and the AlGaN layer 3 are dry-etched through the resist pattern 12 serving as a mask. The passivation film 5 is dry-etched with an etching gas such as $SF_6/CHF_3$ gas. The passivation film 5 is etched at a rate of, for example, about 0.24 μm/min. The AlGaN layer 3 is dry-etched with an etching gas such as a chlorine-based gas. The AlGaN layer 3 is etched at a rate of, for example, about 10 nm/min. Thus, the opening 6 in which the anode is to be formed is formed so as to extend through the AlGaN layer 3 and the passivation film 5. At this time, the AlGaN layer 3 is thus processed to form a JTE structure 10.

The resist pattern 12 is removed by, for example, ashing with oxygen plasma.

Figure 4B:
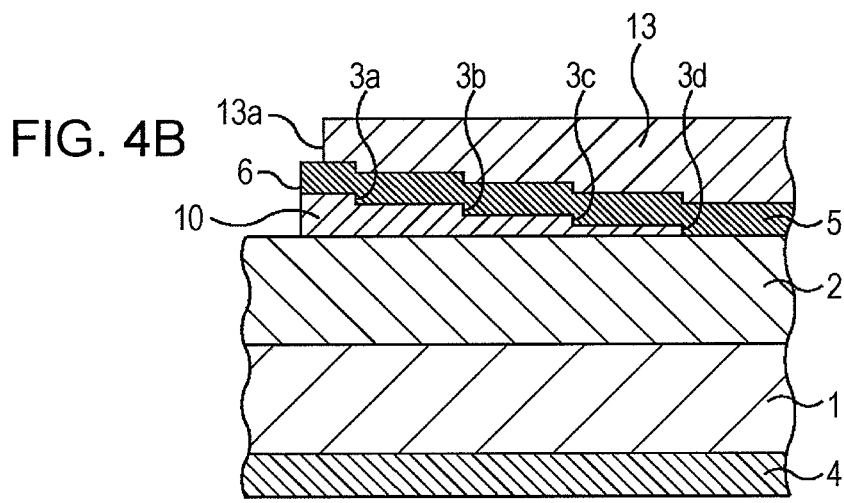

Referring to FIG. 4B, a resist pattern 13 for forming the anode is subsequently formed. Specifically, resist is applied to the passivation film 5 and the opening 6 and the applied resist is patterned by lithography. As a result, the resist pattern 13 having an opening 13a through which the opening 6 and a region of the passivation film 5 around the opening 6 are exposed is formed.

Figure 4C:
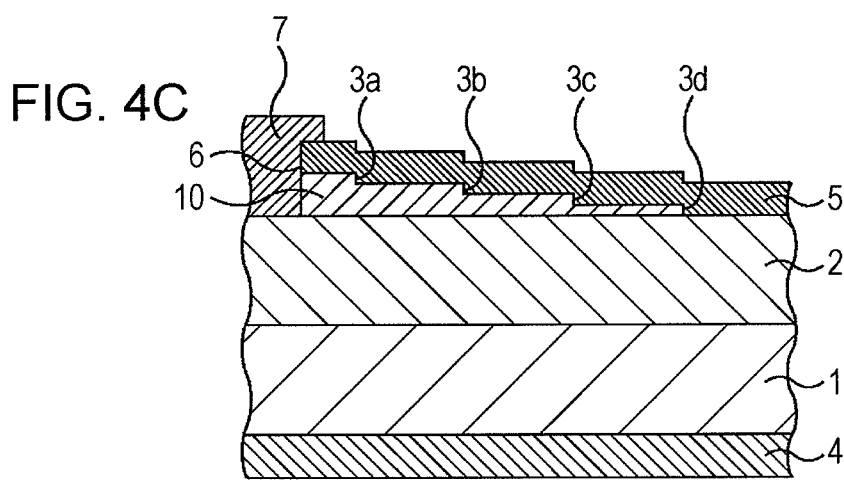

Referring to FIG. 4C, an anode 7 is subsequently formed. Specifically, electrode materials (for example, Ni and Au) are deposited onto the resist pattern 13 so as to fill the opening 13a by, for example, vacuum deposition such that a Ni film having a thickness of about 100 nm and a Au film having a thickness of about 300 nm are formed.

The resist pattern 13 together with the electrode materials thereon are removed by a liftoff process. Thus, the anode 7 is formed so as to fill the opening 6 and overhang a region of the passivation film 5 around the opening 6 by, for example, about 2 μm. The anode 7 is in contact with the n-GaN layer 2 at the bottom of the opening 6 and also in contact with the JTE structure 10 in the side surface of the opening 6.

Figure 5:
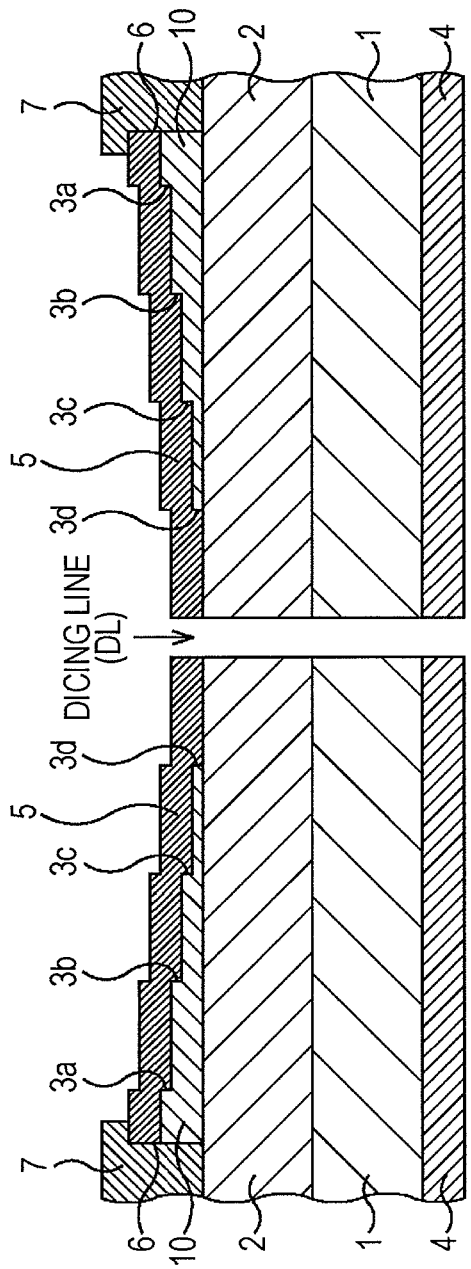
FIG. 5 is a schematic sectional view illustrating a step (subsequent to the step in FIG. 4C) of a method for producing a SBD according to the first embodiment.

Referring to FIG. 5, the n-GaN substrate 1 is subsequently divided along a dicing line (DL) into chips. Thus, SBDs according to the first embodiment are formed.

Figure 6:
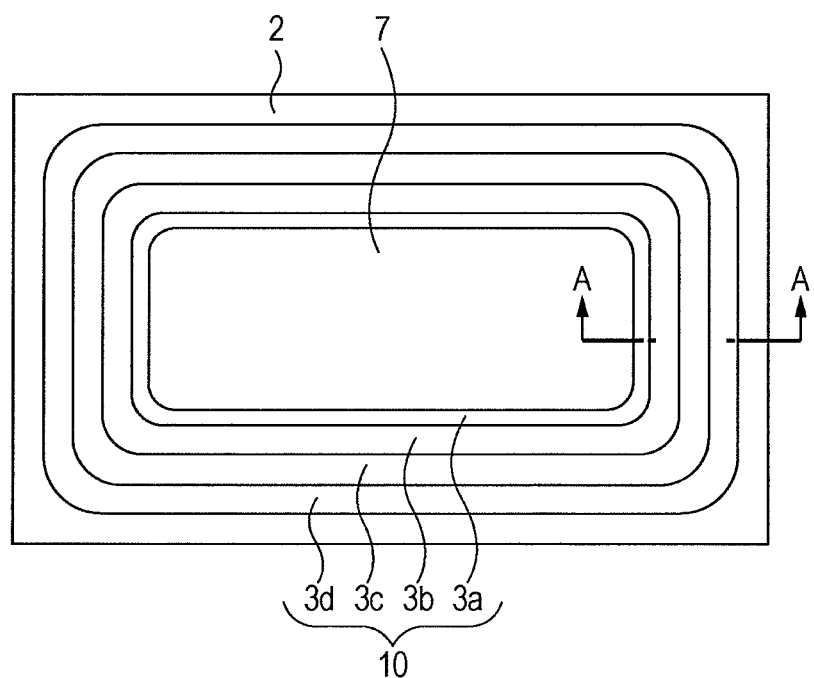
FIG. 6 is a schematic plan view of a SBD according to the first embodiment.

FIG. 6 illustrates a plan view of one of the thus-formed SBDs. In FIG. 6, the passivation film 5 is abbreviated. A section taken along the line A-A in FIG. 6 corresponds to FIGS. 1A to 4C and the left part of FIG. 5. In the SBD, the anode 7 substantially having the shape of a rectangle is formed in the central area on the n-GaN layer 2 to form the JTE structure 10 having the shape of a frame surrounding the anode 7. The JTE structure 10 includes the first stepped portion 3a, the second stepped portion 3b, the third stepped portion 3c, and the fourth stepped portion 3d. These portions form a stepped structure whose thickness decreases stepwise with increasing distance from the anode 7.

For example, when a GaN layer is formed and an AlGaN layer is formed on the (0001) face (that is, Ga face) of the GaN layer, two-dimensional electron gas (2DEG) is generally generated in a region of the GaN layer, the region being located at the interface between the GaN layer and the AlGaN layer, owing to spontaneous polarization and piezoelectric polarization. In contrast, when an AlGaN layer is formed on the N face of a GaN layer, two-dimensional hole gas (2DHG) is generated in a region of the GaN layer, the region being located at the interface between the GaN layer and the AlGaN layer, owing to spontaneous polarization and piezoelectric polarization.

The result of a simulation in terms of the distribution of an electric field intensity in a semiconductor near-surface portion of the SBD of the first embodiment in comparison with comparative examples will be described.

Figure 7:
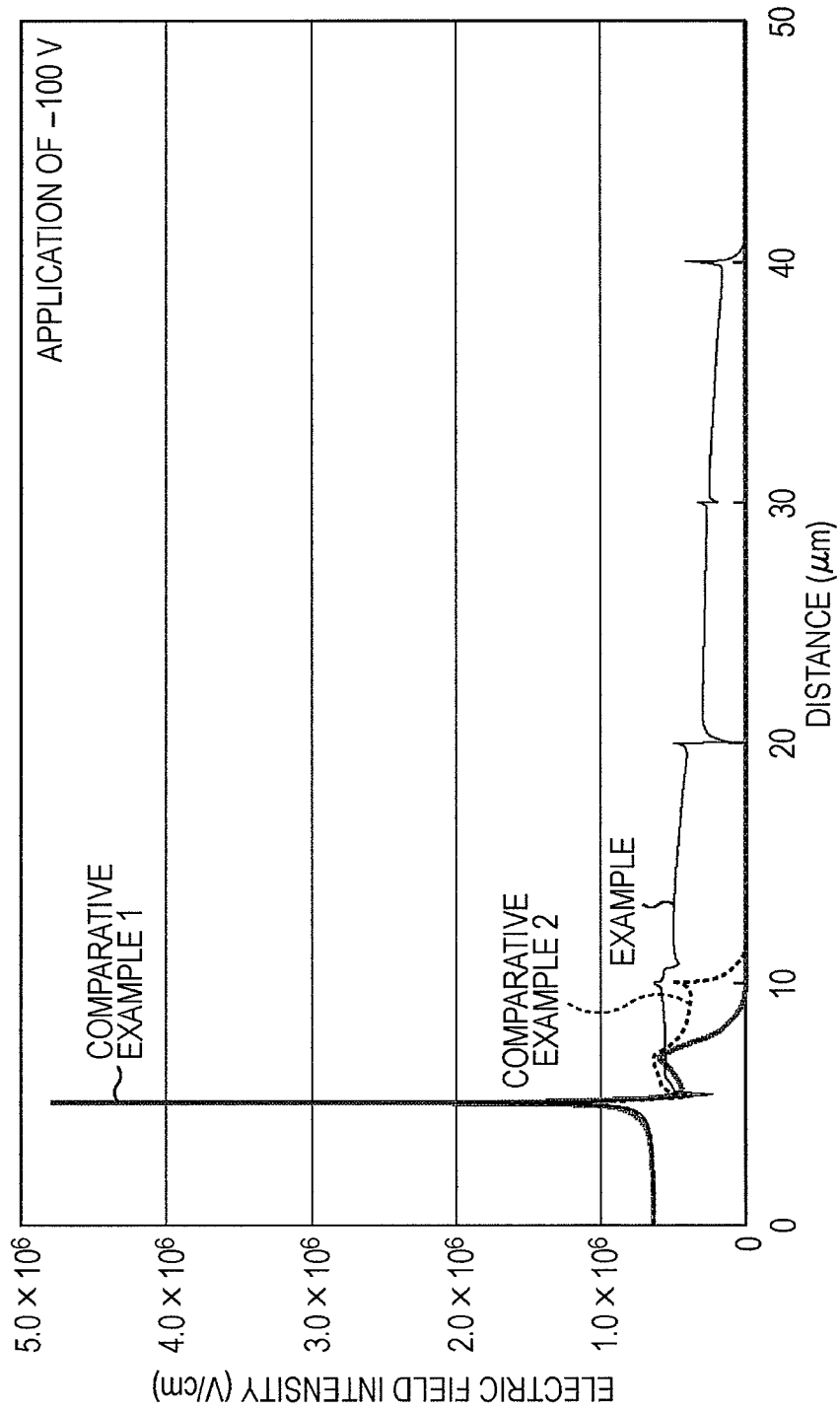
FIG. 7 is a graph illustrating the relationships between the distance ($\mu m$) from an end of the anode (electrode end) of a SBD and electric field intensity (V/cm) in terms of a SBD according to the first embodiment and SBDs of comparative examples.

FIG. 7 is a graph illustrating the relationships between the distance (μm) from an end of the anode (electrode end) of a SBD and electric field intensity (V/cm).

In FIG. 7, "EXAMPLE" represents the SBD of the first embodiment that has the JTE structure 10 and is produced by the above-described steps; "COMPARATIVE EXAMPLE 1" represents a SBD that does not have the JTE structure 10; and "COMPARATIVE EXAMPLE 2" represents a SBD that has, instead of the JTE structure 10, an AlGaN layer having a uniform thickness of about 20 nm and a width of about 10 μm. FIG. 7 illustrates the simulation result of the distribution of electric field intensity in a semiconductor near-surface portion under the application of a reverse voltage of −100 V. The semiconductor near-surface portion is defined as a portion 1 nm away from the surface of the JTE structure 10 in EXAMPLE; a portion 1 nm away from the surface of the n-GaN layer 2 in COMPARATIVE EXAMPLE 1; and a portion 1 nm away from the surface of the AlGaN layer in COMPARATIVE EXAMPLE 2. In EXAMPLE and COMPARATIVE EXAMPLE 2, a negative fixed charge of −5.38× $10^{12}$/cm$^2$ was set at the AlGaN/GaN interface.

FIG. 7 illustrates the following distributions of electric field intensity. In COMPARATIVE EXAMPLE 1, the electric field is concentrated in a region near the electrode end and the maximum electric field intensity at the electrode end is very high. In COMPARATIVE EXAMPLE 2, the electric field is distributed in a region from the electrode end to a position about 10 μm away from the electrode end, the region corresponding to the width of the AlGaN layer, and the maximum electric field intensity is far lower than that of COMPARATIVE EXAMPLE 1. In EXAMPLE, the electric field intensity mildly decreases stepwise with increasing distance from the electrode end in accordance with the first to fourth stepped portions 3a to 3d of the JTE structure 10; and the maximum electric field intensity is lower than that of COMPARATIVE EXAMPLE 2.

Figure 8:
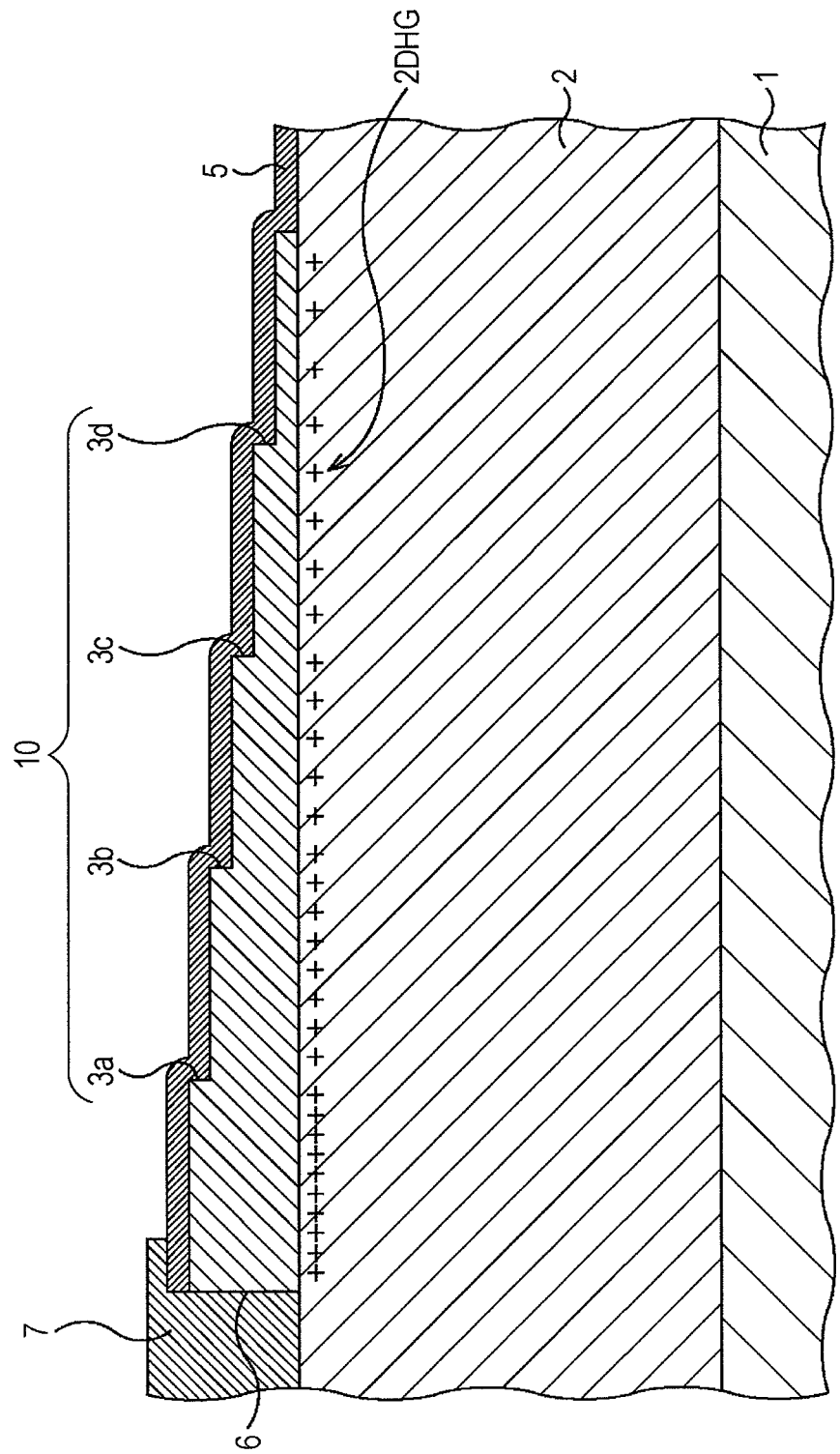
FIG. 8 is a schematic sectional view illustrating generation of 2DHG in a SBD according to the first embodiment.

The simulation result indicates that impact ionization is less likely to occur and high-breakdown-voltage is achieved in EXAMPLE, compared with COMPARATIVE EXAMPLEs 1 and 2. Referring to FIG. 8 (where the cathode 4 is not illustrated), in EXAMPLE, that is, the first embodiment, 2DHG is generated in a region of the n-GaN layer 2, the region being located at the interface between the n-GaN layer 2 and the JTE structure 10. The hole concentration of 2DHG decreases stepwise with increasing distance from the electrode end in accordance with the first to fourth stepped portions 3a to 3d of the JTE structure 10. This means that the smaller the thickness of the JTE structure 10 at a predetermined position on the n-GaN layer 2, the lower the hole concentration of 2DHG at the corresponding position. By generating 2DHG such that the hole concentration thereof gradually decreases with increasing distance from the electrode end, electric field concentration may be gradually reduced.

Such an advantage may also be achieved in the case of forming an InAlN layer or an InGaAlN layer on the n-GaN layer 2 instead of the AlGaN layer 3 and in the case of forming an n-AlGaN layer on a surface of the n-GaN substrate 1 instead of the n-GaN layer 2. Specifically, in these cases, 2DHG is also generated such that the hole concentration thereof gradually decreases with increasing distance from the electrode end and electric field concentration may be gradually reduced. In particular, InAlN has a higher tendency of spontaneous polarization and larger band gap than AlGaN. Accordingly, by forming a JTE structure composed of InAlN on the n-GaN layer 2, 2DHG having the above-described distribution may be reliably formed.

As described above, according to the first embodiment, highly reliable SBDs may be achieved in which the intended concentration distribution of 2DHG is readily and reliably achieved without ion implantation and electric field concentration is gradually reduced.

Modifications

Hereinafter, modifications of the first embodiment will be described.

First Modification

The first modification discloses a SBD that is a compound semiconductor device having a JTE structure as with the first embodiment; however, the SBD is different from that of the first embodiment in that compound semiconductor layers are stacked on the Ga face of the n-GaN substrate 1.

Figure 9:
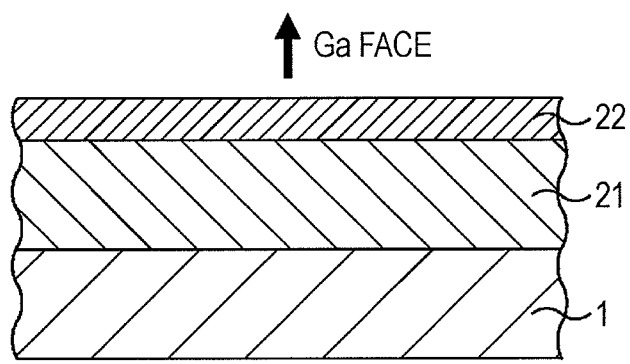
FIG. 9 is a schematic sectional view illustrating a step of a method for producing a SBD according to a first modification of the first embodiment.

FIGS. 9 and 10 are schematic sectional views sequentially illustrating steps of a method for producing a SBD according to the first modification of the first embodiment.

In the first modification, referring to FIG. 9, an n-GaN layer 21 and an InGaN layer 22 are sequentially formed on a (0001) face (Ga face) of the n-GaN substrate 1. Specifically, for example, the n-GaN substrate 1 is used as a growth substrate. The n-GaN substrate 1 contains n-type impurities such as Si at a predetermined concentration (for example, about $1\times10^{18}$/cm$^3$).

The n-GaN layer 21 and the InGaN layer 22 are sequentially grown on a surface of the n-GaN substrate 1 (herein, Ga face) by, for example, MOCVD. The n-GaN layer 21 is formed so as to have a Ga-face surface; have a thickness of, for example, about 5 μm; and contain n-type impurities such as Si at a concentration of about $1\times10^{16}$/cm$^3$. The InGaN layer 22 is formed on the Ga face of the n-GaN layer 2 so as to have an In content of, for example, about 10% and a thickness of, for example, about 20 nm.

Alternatively, instead of forming the InGaN layer 22, an InAlN layer or an InAlGaN layer may be formed on the n-GaN layer 21.

As in the first embodiment, the cathode 4 is subsequently formed by the step illustrated in FIG. 1B. The InGaN layer 22 is dry-etched through lithographic processes by the steps illustrated in FIGS. 1C to 3A. The passivation film 5 is formed so as to cover the InGaN layer 22 by the step illustrated in FIG. 3B. The passivation film 5 and the InGaN layer 22 are dry-etched by the steps illustrated in FIGS. 3C and 4A to form a JTE structure 20. The anode 7 is formed by the steps illustrated in FIGS. 4B and 4C. Referring to FIG. 10, the n-GaN substrate 1 is subsequently divided along a dicing line into chips. Thus, SBDs according to the first modification are formed.

The SBD in FIG. 10 has the JTE structure 20 composed of InGaN on the n-GaN layer 21. As with the JTE structure 10 in the first embodiment, the JTE structure 20 on the n-GaN layer 21 is formed so as to have a stepped structure in which the thickness of the first, second, third, and fourth stepped portions 22a, 22b, 22c, and 22d of the InGaN layer 22 decreases stepwise in this order. As in the case of the AlGaN layer 3, although the InGaN layer 22 is also etched to a depth of 5 nm four times in the first modification, the number of times etching is performed and the etching depth may be freely determined.

When an InGaN layer is formed on the Ga face of a GaN layer, 2DHG is generally generated in a region of the GaN layer, the region being located at the interface between the GaN layer and the InGaN layer, owing to spontaneous polarization and piezoelectric polarization.

Referring to FIG. 11, in the SBD of the first modification, 2DHG is generated in a region of the n-GaN layer 21, the region being located at the interface between the n-GaN layer 21 and the JTE structure 20. The hole concentration of 2DHG decreases stepwise with increasing distance from the electrode end in accordance with the first to fourth stepped portions 22a to 22d of the JTE structure 20. This means that the smaller the thickness of the JTE structure 20 at a predetermined position on the n-GaN layer 21, the lower the hole concentration of 2DHG at the corresponding position. By generating 2DHG such that the hole concentration thereof mildly decreases with increasing distance from the electrode end, electric field concentration may be gradually reduced.

As described above, according to the first modification, highly reliable SBDs may be achieved in which the intended concentration distribution of 2DHG is readily and reliably achieved without ion implantation and electric field concentration is gradually reduced.

Second Modification

The second modification discloses a SBD that is a compound semiconductor device having a JTE structure as with the first embodiment; however, the SBD is different from that of the first embodiment in that it has a floating electrode.

FIGS. 12A to 14 are schematic sectional views sequentially illustrating steps of a method for producing a SBD according to the second modification of the first embodiment.

As in the first embodiment, the steps illustrated in FIGS. 1A to 3B are conducted in the second modification. As a result, the passivation film 5 is formed so as to cover the AlGaN layer 3.

Figure 12A:
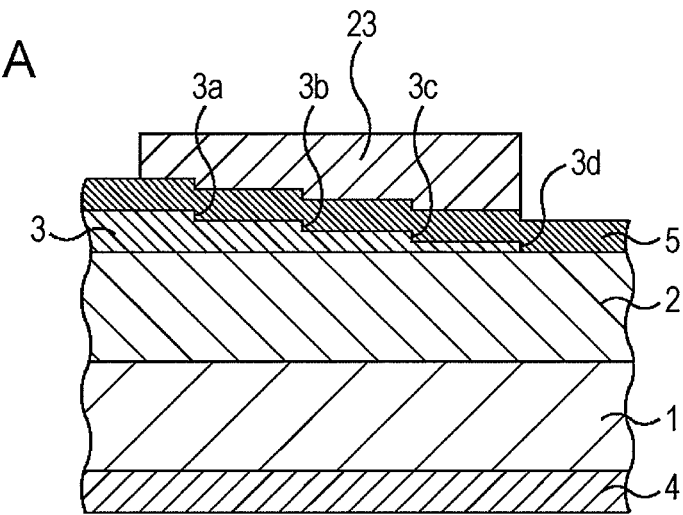
FIGS. 12A and 12B are schematic sectional views sequentially illustrating steps of a method for producing a SBD according to a second modification of the first embodiment.

Referring to FIG. 12A, a resist pattern 23 is then formed. Specifically, resist is applied to the passivation film 5 and the applied resist is patterned by lithography so as to form openings through which a region where an anode is to be formed and a region where a floating electrode is to be formed (floating-electrode-forming region) in the active area on the passivation film 5 are exposed. Thus, the resist pattern 23 is formed.

Figure 12B:
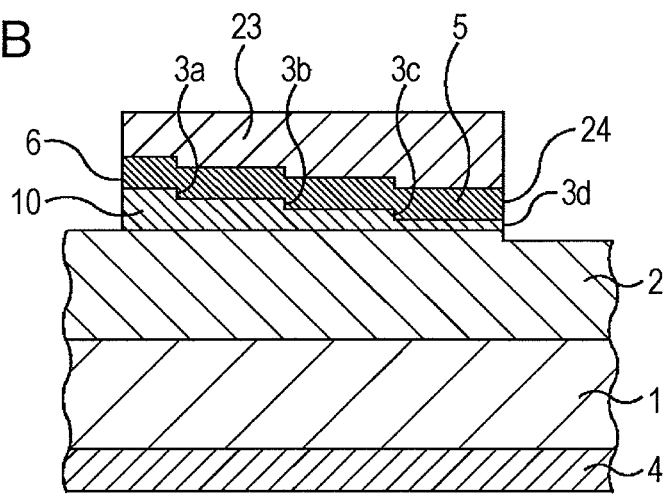

Referring to FIG. 12B, an opening 6 in which the anode is to be formed is formed so as to extend through the passivation film 5 and the AlGaN layer 3; and an opening 24 in which the floating electrode is to be formed is formed so as to extend through the passivation film 5. Specifically, the passivation film 5 and the AlGaN layer 3 are dry-etched through the resist pattern 23 serving as a mask. The passivation film 5 is dry-etched with an etching gas such as $SF_6/CHF_3$ gas. The passivation film 5 is etched at a rate of, for example, about 0.24 μm/min. The AlGaN layer 3 is dry-etched with an etching gas such as a chlorine-based gas. The AlGaN layer 3 is etched at a rate of, for example, about 10 nm/min. As a result of this dry-etching, in the floating-electrode-forming region, a portion of the surface of the n-GaN layer 2 is etched. Thus, the opening 6 in which the anode is to be formed is formed so as to extend through the passivation film 5 and the AlGaN layer 3; and the opening 24 in which the floating electrode is to be formed is formed so as to extend through the passivation film 5. At this time, the AlGaN layer 3 is thus processed to form the JTE structure 10.

The resist pattern 23 is removed by, for example, ashing with oxygen plasma.

Figure 13A:
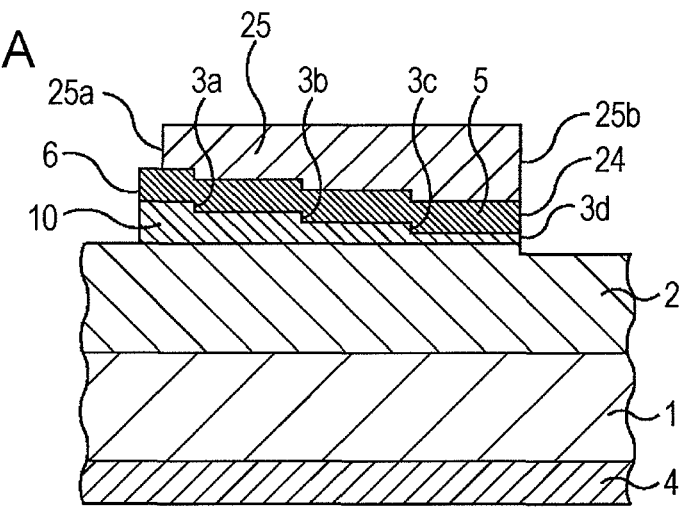
FIGS. 13A and 13B are schematic sectional views sequentially illustrating steps (subsequent to the step in FIG. 12B) of a method for producing a SBD according to the second modification of the first embodiment.

Referring to FIG. 13A, a resist pattern 25 for forming the anode and the floating electrode is subsequently formed. Specifically, resist is applied to the passivation film 5 and the openings 6 and 24 and the applied resist is patterned by lithography. As a result, the resist pattern 25 having an opening 25a through which the opening 6 and a region of the passivation film 5 around the opening 6 are exposed and an opening 25b through which the opening 24 is exposed is formed. As with the opening 25a, the opening 25b may be formed such that the opening 24 and a region of the passivation film 5 around the opening 24 are exposed through the opening 25b.

Figure 13B:
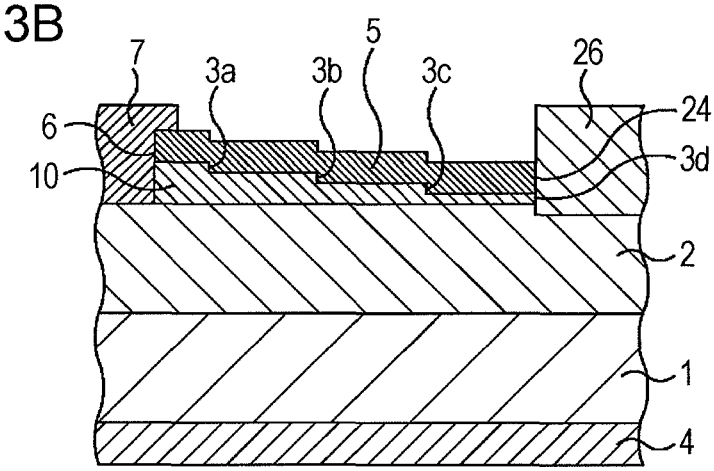

Referring to FIG. 13B, the anode 7 and a floating electrode 26 are subsequently formed. Specifically, electrode materials (for example, Ni and Au) are deposited onto the resist pattern 25 so as to fill the openings 25a and 25b by, for example, vacuum deposition such that a Ni film having a thickness of about 100 nm and a Au film having a thickness of about 300 nm are formed.

The resist pattern 25 together with the electrode materials thereon are removed by a liftoff process. Thus, the anode 7 is formed so as to fill the opening 6 and overhang a region of the passivation film 5 around the opening 6 by, for example, about 2 μm; and the floating electrode 26 is formed so as to fill the opening 24 and project above the passivation film 5. The anode 7 is in contact with the n-GaN layer 2 at the bottom of the opening 6 and also in contact with the JTE structure 10 in the side surface of the opening 6. As with the anode 7, the floating electrode 26 may be formed so as to fill the opening 24 and overhang a region of the passivation film 5 around the opening 24.

Figure 14:
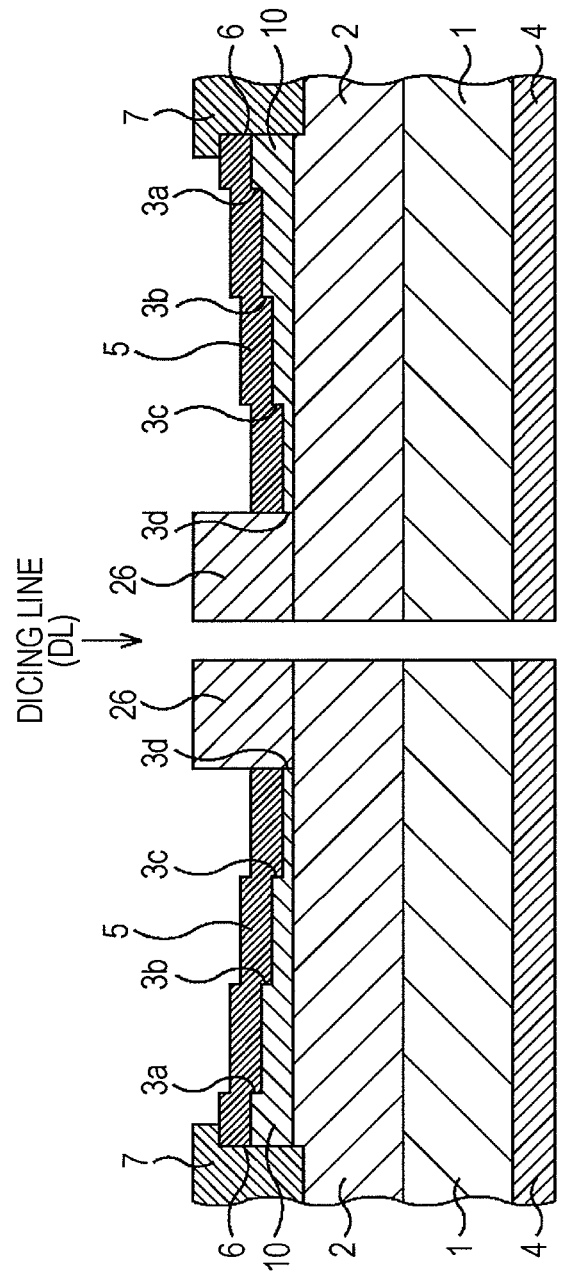
FIG. 14 is a schematic sectional view illustrating a step (subsequent to the step in FIG. 13B) of a method for producing a SBD according to the second modification of the first embodiment.

Referring to FIG. 14, the n-GaN substrate 1 is subsequently divided along a dicing line (DL) into chips. Thus, SBDs according to the second modification are formed.

Figure 15:
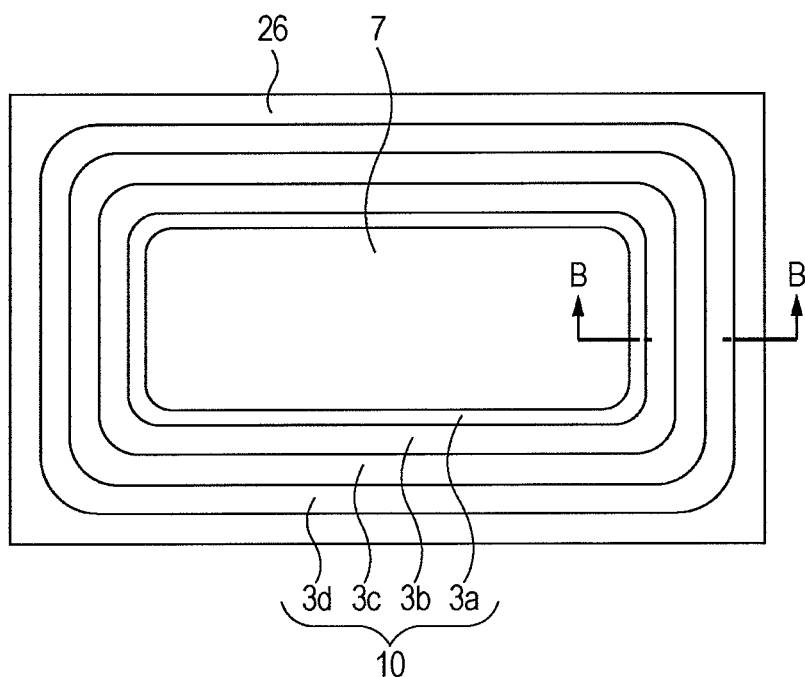
FIG. 15 is a schematic plan view of a SBD according to the second modification of the first embodiment.

FIG. 15 illustrates a plan view of one of the thus-formed chips. In FIG. 15, the passivation film 5 is abbreviated. A section taken along the line B-B in FIG. 15 corresponds to FIGS. 12A to 13B and the left part of FIG. 14. The floating electrode 26 is formed so as to have the shape of a frame surrounding the JTE structure 10. The floating electrode 26 is in contact with the n-GaN layer 2 at the bottom of the opening 24 and also in contact with the JTE structure 10 in the side surface of the opening 24. Unlike the anode 7, the surface of the floating electrode 26 is not connected to, for example, a lead, and the floating electrode 26 is electrically floated.

As described above, according to the second modification, highly reliable SBDs may be achieved in which the intended concentration distribution of 2DHG is readily and reliably achieved without ion implantation and electric field concentration is gradually reduced. In addition, since such a SBD includes the floating electrode 26, the potential of the JTE structure 10 is stabilized. Since the floating electrode 26 is formed by the step of forming the anode 7, an extra step is not necessary for forming the floating electrode 26.

Second Embodiment

The second embodiment discloses a SBD that is a compound semiconductor device having a JTE structure as with the first embodiment; however, the SBD is different from that of the first embodiment in that the JTE structure has a different configuration.

FIGS. 16A to 19 are schematic sectional views sequentially illustrating steps of a method for producing a SBD according to the second embodiment.

Figure 16A:
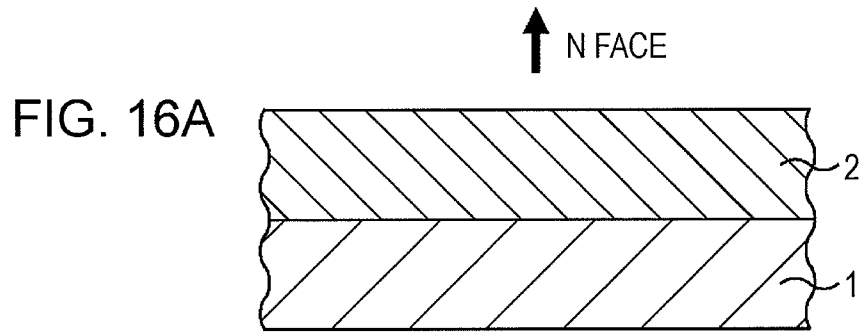
FIGS. 16A to 16C are schematic sectional views sequentially illustrating steps of a method for producing a SBD according to a second embodiment.

In the second embodiment, referring to FIG. 16A, an n-GaN layer 2 is formed on a surface of the n-GaN substrate 1. The n-GaN layer 2 is formed on the N face of the n-GaN substrate 1 as with the n-GaN layer 2 described with FIG. 1A in the first embodiment.

Figure 16B:
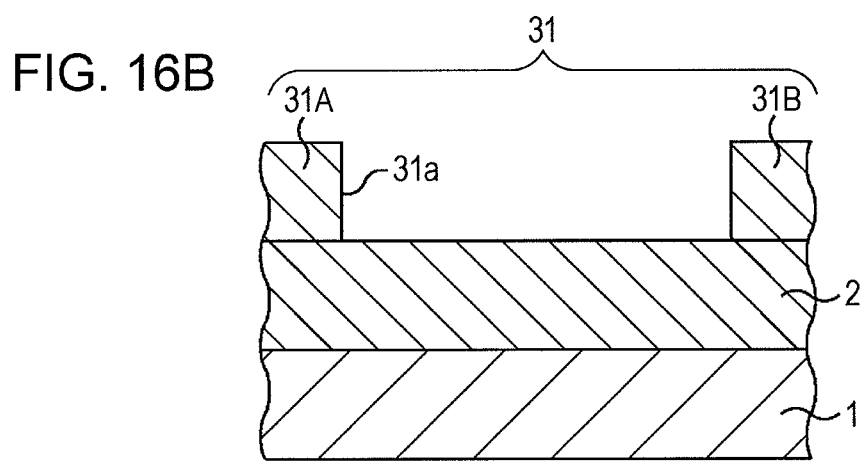

Referring to FIG. 16B, a mask 31 for forming the JTE structure is then formed on the n-GaN layer 2. Specifically, a mask material such as silicon oxide is deposited on the n-GaN layer 2 by, for example, thermal CVD so as to form a film having a thickness of about 5 μm. Resist is applied to the silicon oxide film and the applied resist is patterned by lithography. Thus, a resist pattern having an opening corresponding to a region where the JTE structure is to be formed on the n-GaN layer 2 is formed. The silicon oxide film is subjected to wet etching with, for example, hydrofluoric acid with the resist pattern serving as a mask. The resist pattern is removed by, for example, ashing. Thus, the mask 31 having an opening 31a through which the region where the JTE structure is to be formed (JTE-structure-forming region) on the surface of the n-GaN layer 2 is exposed is formed. As described in the first embodiment, the JTE-structure-forming region is a frame-shaped region surrounding the anode to be formed in a later step on the n-GaN layer 2. In the mask 31, a shielding portion 31A covers a region where the anode is to be formed, the region being located in an inner area with respect to the frame-shaped region; a shielding portion 31B covers an outer area with respect to the frame-shaped region; and the opening 31a is formed between the shielding portions 31A and 31B. The mask material preferably forms a mask on which a compound semiconductor such as polycrystalline AlGaN is deposited. Other than silicon oxide, for example, silicon nitride or silicon oxynitride may be used as the mask material.

Figure 16C:
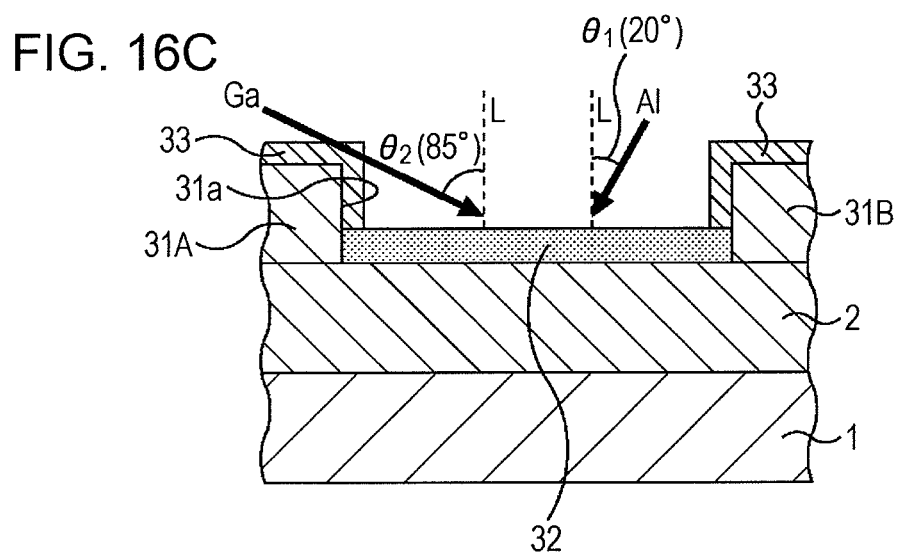

Referring to FIG. 16C, an AlGaN layer 32 is then grown. Specifically, AlGaN is grown as a compound semiconductor by, for example, plasma assist molecular beam epitaxy (PAMBE).

In PAMBE, Al, Ga, and N serving as sources are made incident on the surface of the n-GaN layer 2 and the mask 31 in an ultra-high vacuum. In an ultra-high vacuum, source molecules have a long mean free path and hence move straight forward without collisions with each other to reach the surface of the n-GaN layer 2. Accordingly, when the incident angle is made close to 180° (parallel) with respect to the surface of the n-GaN layer 2, the mask 31 prevents source molecules from reaching the surface of the n-GaN layer 2 in regions under the shadow of the mask 31. Thus, by changing the incident angle of source molecules, the amount of the source molecules reaching the surface of the n-GaN layer 2 may be varied. In the second embodiment, such a technique is used to form an Al content distribution in the AlGaN layer.

Specifically, Al is made incident at an incident angle (first angle) $\theta_1$ tilted toward the shielding portion 31B of the mask 31 with reference to a line L normal to the surface of the n-GaN layer 2 while Ga is made incident at an incident angle (second angle) $\theta_2$ tilted toward the shielding portion 31A with reference to the normal line L. The second angle $\theta_2$ for Ga is made larger than the first angle $\theta_1$ for Al. For example, the first angle is made about 20°, which is a general angle in PAMBE, whereas the second angle is made about 85°. Since the mask 31 has a thickness of about 5 μm, the Al content may be varied over a width of about 50 μm.

The growth temperature in PAMBE is about 720° C. The flux of sources including Al is adjusted such that the Al content decreases with increasing distance from the shielding portion 31A: for example, in a region near the shielding portion 31A, an Al content of about 0.15; and in a region near the shielding portion 31B, an Al content of about 0.05.

Thus, the AlGaN layer 32 having a thickness of about 20 nm and is monocrystalline is grown in the opening 31a of the mask 31 and on the surface of the n-GaN layer 2. In the AlGaN layer 32, the Al content gradually decreases with increasing distance from the shielding portion 31A of the mask 31. An AlGaN layer 33 that is polycrystalline is deposited on the mask 31.

Alternatively, instead of forming the AlGaN layer 32, an InAlN layer or an InAlGaN layer may be grown on the N face of the n-GaN layer 2.

In the case of growing an InAlN layer, PAMBE is performed in the same manner as in FIG. 16C. Specifically, Al is made incident at a first angle tilted toward the shielding portion 31B of the mask 31 with reference to a line L normal to the surface of the n-GaN layer 2 while In is made incident at a second angle tilted toward the shielding portion 31A with reference to the normal line L. The second angle is made larger than the first angle. As a result, an InAlN layer is formed such that the Al content gradually decreases with increasing distance from the anode 7, stated another way, the In content relatively gradually increases with increasing distance from the anode 7.

In the case of growing an InAlGaN layer, PAMBE is performed in the same manner as in FIG. 16C. Specifically, Al is made incident at a first angle tilted toward the shielding portion 31B of the mask 31 with reference to a line L normal to the surface of the n-GaN layer 2 while In and Ga are made incident at a second angle tilted toward the shielding portion 31A with reference to the normal line L. The second angle is made larger than the first angle. As a result, an InAlGaN layer is formed such that the Al content gradually decreases with increasing distance from the anode 7, stated another way, the In and Ga contents relatively gradually increase with increasing distance from the anode 7.

Alternatively, instead of forming the n-GaN layer 2, an n-AlGaN layer may be formed on the surface of the n-GaN substrate 1. In this case, the Al content of the n-AlGaN layer is made higher than that of the AlGaN layer 32 formed thereon, that is, higher than the Al content of a region of the AlGaN layer 32 close to the anode 7.

Figure 17A:
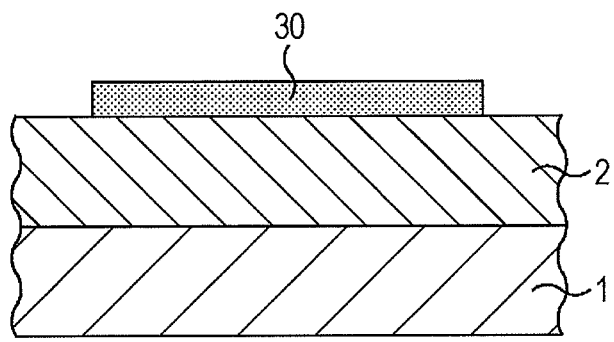
FIGS. 17A to 17C are schematic sectional views sequentially illustrating steps (subsequent to the step in FIG. 16C) of a method for producing a SBD according to the second embodiment.

Referring to FIG. 17A, a JTE structure 30 is subsequently formed. Specifically, the AlGaN layer 33 that is polycrystalline is removed by wet etching with, for example, a KOH solution and the mask 31 is removed by wet etching with, for example, hydrofluoric acid. Thus, the JTE structure 30 including the AlGaN layer 32 is formed on the n-GaN layer 2.

Figure 17B:
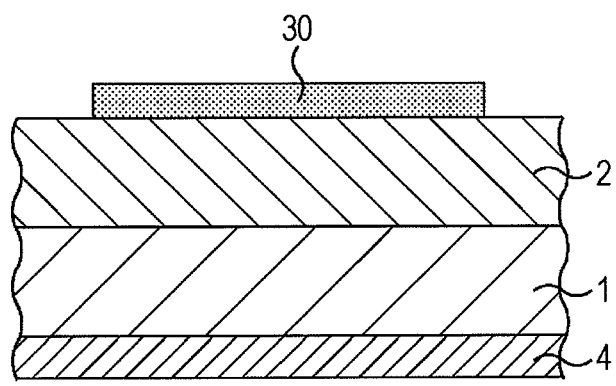

Referring to FIG. 17B, the cathode 4 is subsequently formed on the back surface of the n-GaN substrate 1. Specifically, electrode materials (for example, Ti and Al) are deposited onto the entire back surface of the n-GaN substrate 1 by, for example, vacuum deposition such that a Ti film having a thickness of about 30 nm and an Al film having a thickness of about 300 nm are formed. The deposited Ti and Al films are subjected to RTA at, for example, about 600° C. Thus, the cathode 4 covering the back surface of the n-GaN substrate 1 is formed.

Figure 17C:
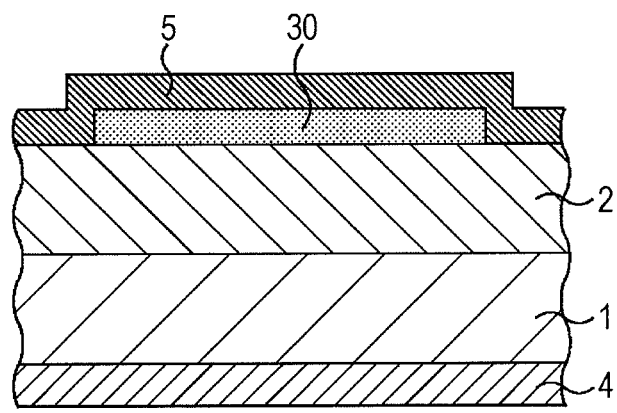

Referring to FIG. 17C, the passivation film 5 is subsequently formed. Specifically, an insulating substance such as SiN is deposited on the n-GaN layer 2 by plasma CVD so as to form a film covering the JTE structure 30 and having a thickness of about 400 nm. Thus, the passivation film 5 covering the JTE structure 30 is formed.

Figure 18A:
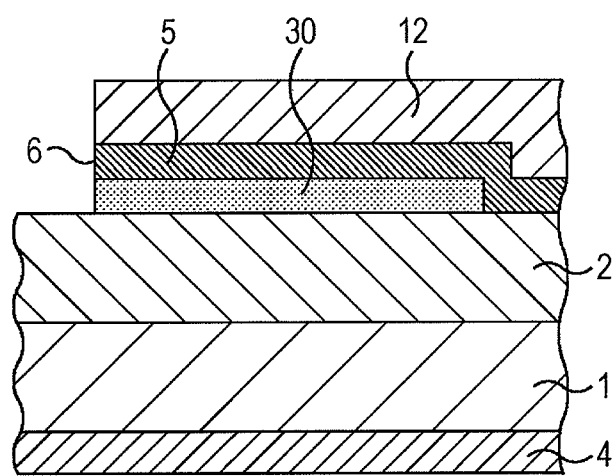
FIGS. 18A and 18B are schematic sectional views sequentially illustrating steps (subsequent to the step in FIG. 17C) of a method for producing a SBD according to the second embodiment.

Referring to FIG. 18A, an opening 6 in which the anode is to be formed is then formed so as to extend through the passivation film 5 and the JTE structure 30. Specifically, resist is applied to the passivation film 5 and the applied resist is patterned by lithography so as to form an opening through which a region where the anode is to be formed in the active area on the passivation film 5 is exposed. Thus, a resist pattern 12 is formed.

The passivation film 5 and the JTE structure 30 are subsequently dry-etched through the resist pattern 12 serving as a mask. The passivation film 5 is dry-etched with an etching gas such as $SF_6/CHF_3$ gas. The passivation film 5 is etched at a rate of, for example, about 0.24 μm/min. The JTE structure 30 is dry-etched with an etching gas such as a chlorine-based gas. The JTE structure 30 is etched at a rate of, for example, about 10 nm/min. Thus, the opening 6 in which the anode is to be formed is formed so as to extend through the passivation film 5 and the JTE structure 30.

The resist pattern 12 is removed by, for example, ashing with oxygen plasma.

Figure 18B:
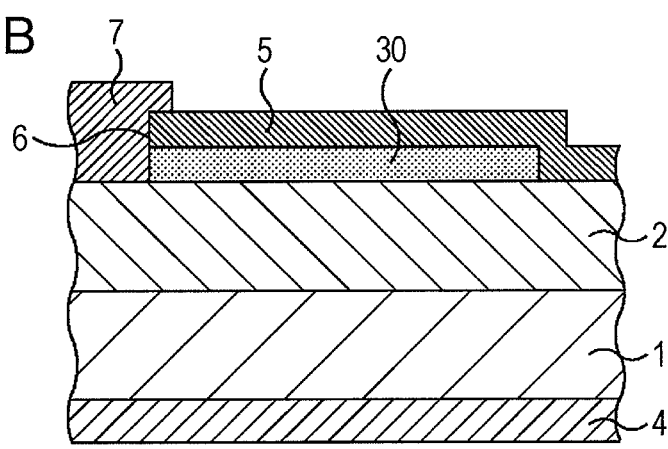

Referring to FIG. 18B, the anode 7 is subsequently formed. Specifically, resist is applied to the passivation film 5 and the opening 6 and the applied resist is patterned by lithography. As a result, a resist pattern having an opening through which the opening 6 and a region of the passivation film 5 around the opening 6 are exposed is formed.

Subsequently, electrode materials (for example, Ni and Au) are deposited onto the resist pattern so as to fill the opening 6 by, for example, vacuum deposition such that a Ni film having a thickness of about 100 nm and a Au film having a thickness of about 300 nm are formed.

The resist pattern together with the electrode materials thereon are removed by a liftoff process. Thus, the anode 7 is formed so as to fill the opening 6 and overhang a region of the passivation film 5 around the opening 6 by, for example, about 2 µm. The anode 7 is in contact with the n-GaN layer 2 at the bottom of the opening 6 and also in contact with the JTE structure 30 in the side surface of the opening 6.

Figure 19:
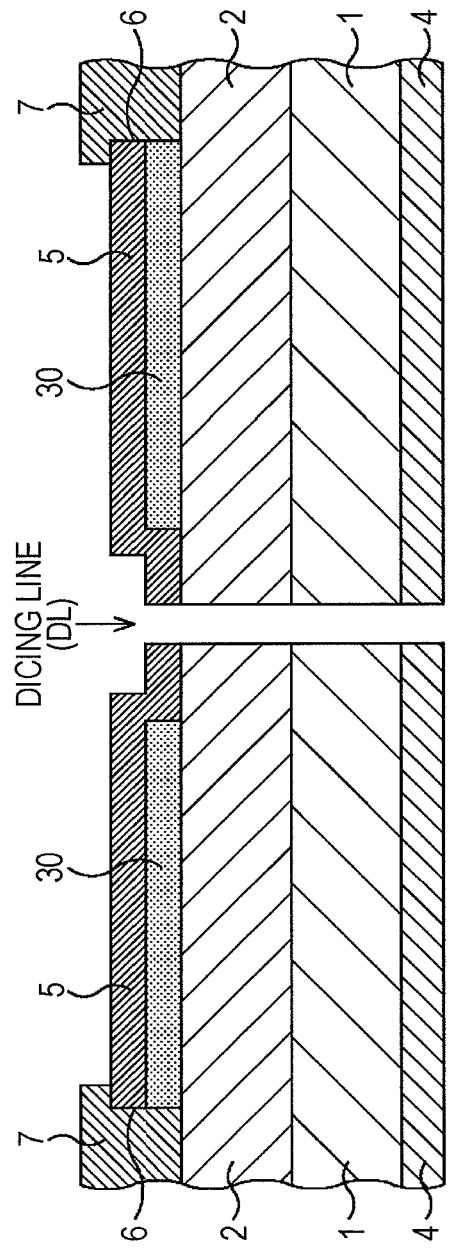
FIG. 19 is a schematic sectional view illustrating a step (subsequent to the step in FIG. 18B) of a method for producing a SBD according to the second embodiment.

Referring to FIG. 19, the n-GaN substrate 1 is subsequently divided along a dicing line (DL) into chips. Thus, SBDs according to the second embodiment are formed.

Figure 20:
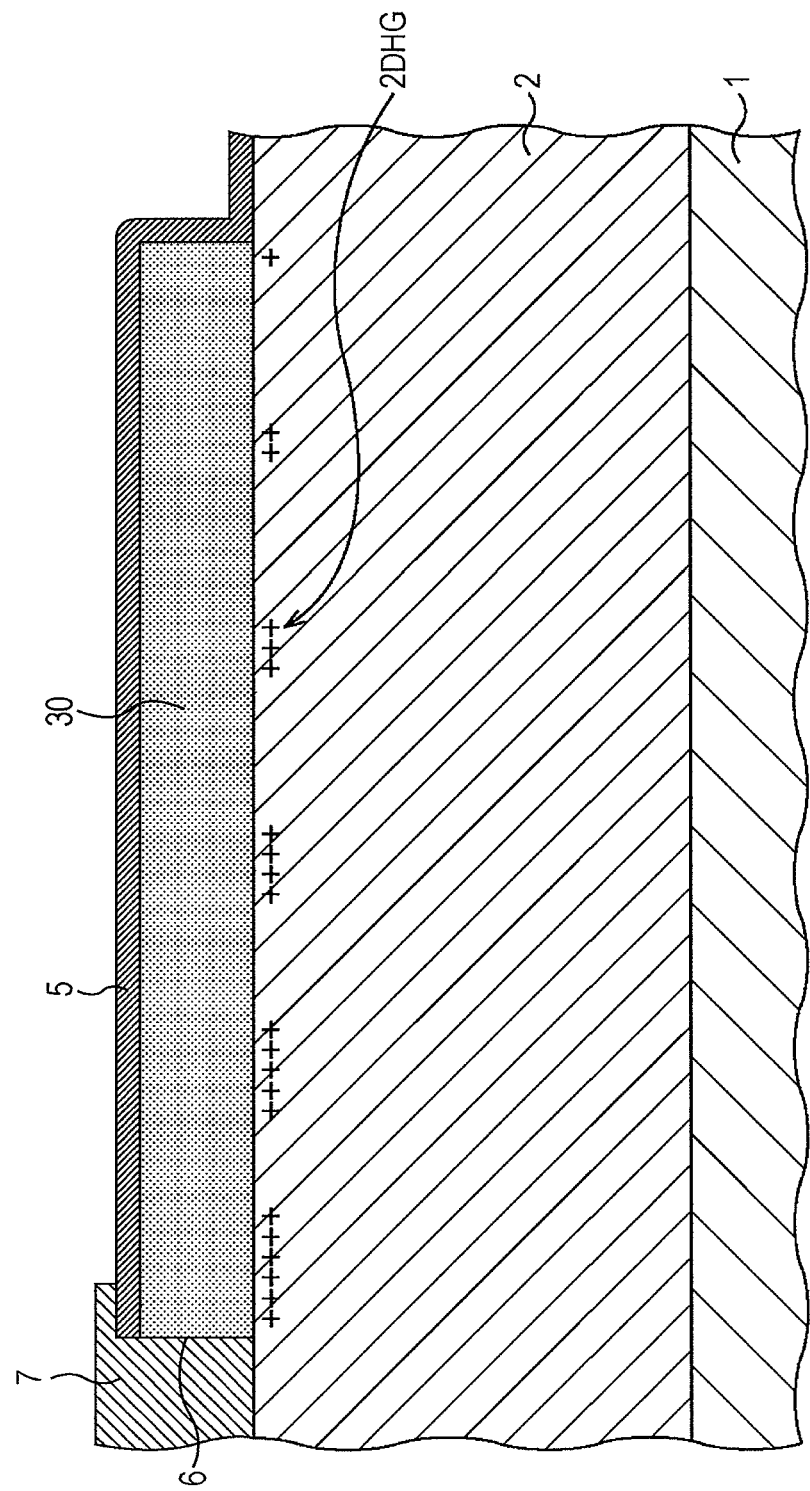
FIG. 20 is a schematic sectional view illustrating generation of 2DHG in a SBD according to the second embodiment.

Referring to FIG. 20 (where the cathode 4 is abbreviated), in the second embodiment, the JTE structure 30 on the N face of the n-GaN layer 2 is composed of AlGaN such that the Al content gradually decreases with increasing distance from the anode 7. In this configuration, 2DHG is induced in a region of the n-GaN layer 2, the region being located at the interface between the n-GaN layer 2 and the JTE structure 30, by fixed charge due to polarization. The hole concentration of the 2DHG decreases with decreasing Al content of the JTE structure 30, that is, with increasing distance from the anode 7. By generating 2DHG such that the hole concentration thereof mildly decreases with increasing distance from the anode 7, electric field concentration may be gradually reduced.

As described above, according to the second embodiment, highly reliable SBDs may be achieved in which the intended concentration distribution of 2DHG is readily and reliably achieved without ion implantation and electric field concentration is gradually reduced. In addition, in the second embodiment, the above-described Al content distribution is achieved in the growth of the AlGaN layer 32 forming the JTE structure 30 to thereby increase the production yield.

The modifications in the first embodiment may also be applied to the second embodiment.

When the first modification is applied, an n-GaN layer (having a Ga-face surface) is formed on the Ga face of the n-GaN substrate 1 and a JTE structure composed of InGaN is formed on the n-GaN layer. The InGaN layer is formed by PAMBE performed in the same manner as in FIG. 16C and In is made incident at a first angle tilted toward the shielding portion 31B of the mask 31 with reference to a line L normal to the surface of the n-GaN layer while Ga is made incident at a second angle tilted toward the shielding portion 31A with reference to the normal line L. The second angle for Ga is made larger than the first angle for In. As a result, the JTE structure composed of InGaN is formed such that the In content gradually decreases with increasing distance from the anode 7.

When the second modification is applied, the anode 7 and the floating electrode are simultaneously formed.

Third Embodiment

The third embodiment discloses a SBD that is a compound semiconductor device having a JTE structure as with the first embodiment; however, the SBD is different from that of the first embodiment in that the JTE structure has a different configuration.

FIGS. 21A to 24 are schematic sectional views sequentially illustrating steps of a method for producing a SBD according to the third embodiment.

Figure 21A:
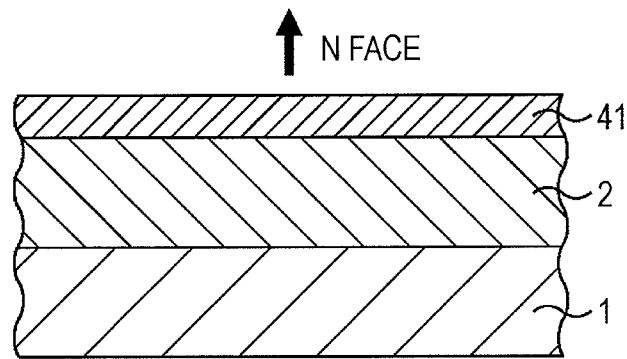
FIGS. 21A to 21C are schematic sectional views sequentially illustrating steps of a method for producing a SBD according to a third embodiment.

Referring to FIG. 21A, an n-GaN layer 2 and an AlGaN layer 41 are sequentially formed on a surface of the n-GaN substrate 1. Specifically, for example, the n-GaN substrate 1 is used as a growth substrate. The n-GaN substrate 1 contains n-type impurities such as Si at a predetermined concentration (for example, about $1 \times 10^{18}/\text{cm}^3$).

The n-GaN layer 2 and the AlGaN layer 41 are sequentially grown on a surface of the n-GaN substrate 1 (herein, N face) by, for example, MOCVD. The n-GaN layer 2 is formed so as to have an N-face surface; have a thickness of, for example, about 5 µm; and contain n-type impurities such as Si at a concentration of about $1 \times 10^{16}/\text{cm}^3$. The AlGaN layer 41 is formed on the N face of the n-GaN layer 2 so as to have an Al content of, for example, about 10% and a thickness of, for example, about 20 nm.

The growth conditions for the n-GaN layer 2 and the AlGaN layer 41 are the same as those for the n-GaN layer 2 and the AlGaN layer 3 described with FIG. 1A in the first embodiment.

Alternatively, instead of forming the AlGaN layer 41, an InAlN layer or an InAlGaN layer may be formed on the n-GaN layer 2.

Alternatively, instead of forming the n-GaN layer 2, an n-AlGaN layer may be formed on a surface of the n-GaN substrate 1. In such a case, the Al content of the n-AlGaN layer is preferably made higher than that of the AlGaN layer 41 formed on the n-AlGaN layer. When the Al content of the AlGaN layer 41 is about 10%, the Al content of the n-AlGaN layer may be, for example, about 20%.

Figure 21B:
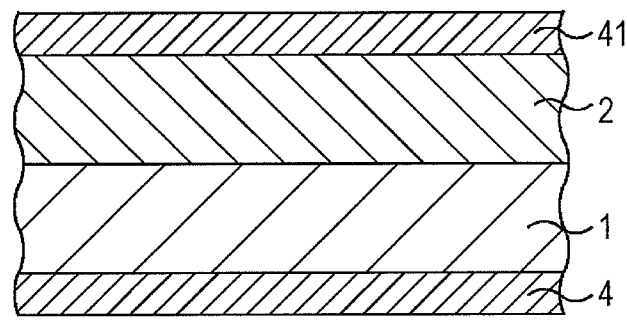

Referring to FIG. 21B, a cathode 4 is subsequently formed on the back surface of the n-GaN substrate 1. Specifically, electrode materials (for example, Ti and Al) are deposited onto the entire back surface of the n-GaN substrate 1 by, for example, vacuum deposition such that a Ti film having a thickness of about 30 nm and an Al film having a thickness of about 300 nm are formed. The deposited Ti and Al films are subjected to RTA at, for example, about 600° C. Thus, the cathode 4 covering the back surface of the n-GaN substrate 1 is formed.

Figure 21C:
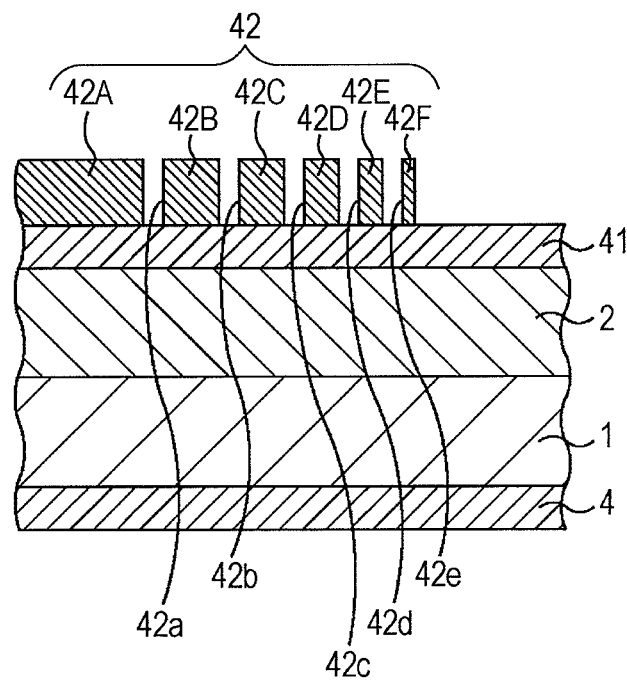

Referring to FIG. 21C, a resist pattern 42 is subsequently formed on the AlGaN layer 41. Specifically, resist is applied to the AlGaN layer 41 and the applied resist is patterned by lithography. Thus, the resist pattern 42 is formed on the AlGaN layer 41. Openings are formed in the resist pattern 42 such that the width of the mask portions of the resist pattern 42 decreases stepwise with increasing distance from the active area positioned at the left end of FIG. 21C. The mask portions of the resist pattern 42 are denoted with 42A, 42B, 42C, 42D, 42E, and 42F. The openings of the resist pattern 42 are denoted with 42*a*, 42*b*, 42*c*, 42*d*, and 42*e*.

Figure 22A:
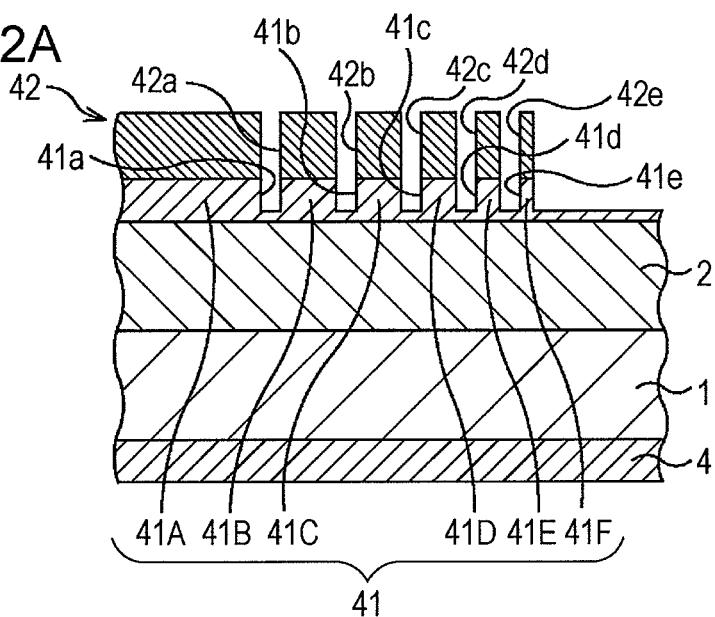
FIGS. 22A to 22C are schematic sectional views sequentially illustrating steps (subsequent to the step in FIG. 21C) of a method for producing a SBD according to the third embodiment.

Referring to FIG. 22A, the AlGaN layer 41 is subsequently etched to form thick-film portions 41A to 41F. Specifically, the AlGaN layer 41 is dry-etched through the resist pattern 42 serving as a mask with an etching gas such as a chlorine-based gas to a predetermined depth, for example, about 15 nm. The AlGaN layer 41 is etched at a rate of, for example, about 10 nm/min. In the AlGaN layer 41, grooves 41*a*, 41*b*, 41*c*, 41*d*, and 41*e* are formed in accordance with the openings 42*a*, 42*b*, 42*c*, 42*d*, and 42*e* of the resist pattern 42. Thus, the thick-film portions 41A, 41B, 41C, 41D, 41E, and 41F are formed in the AlGaN layer 41 such that the width of the thick-film portions decreases stepwise with increasing distance from the left end of FIG. 22A.

The resist pattern 42 is removed by, for example, ashing with oxygen plasma.

Figure 22B:
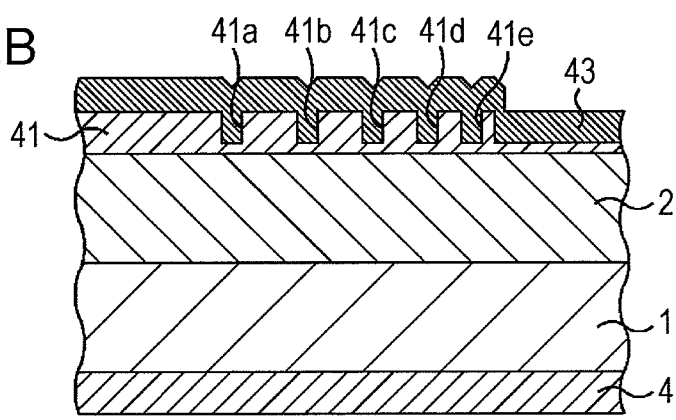

Referring to FIG. 22B, a passivation film 43 is subsequently formed. Specifically, for example, SiN is deposited by plasma CVD so as to form a film covering the AlGaN layer 41 and having a thickness of about 400 nm. Thus, the passivation film 43 covering the AlGaN layer 41 is formed.

Figure 22C:
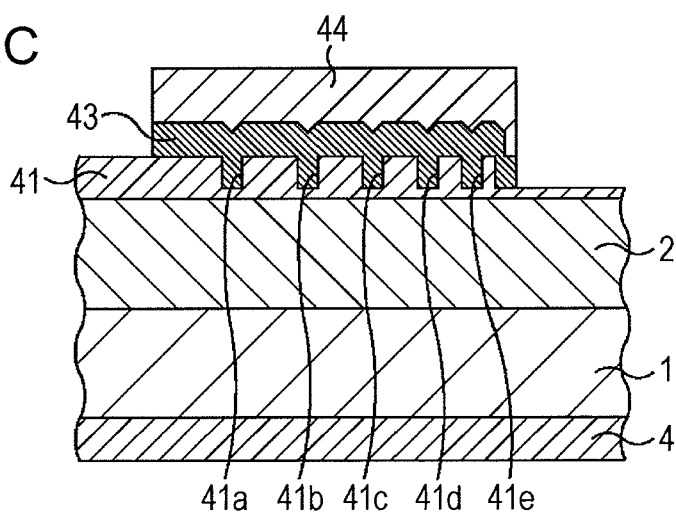

Referring to FIG. 22C, the passivation film 43 is subsequently etched. Specifically, resist is applied to the passivation film 43 and the applied resist is patterned by lithography so as to form, in the active area on the passivation film 43, an opening through which a region where an anode is to be formed (anode-forming region) is exposed and an opening through which a region where a floating electrode is to be formed (floating-electrode-forming region) is exposed. Thus, a resist pattern 44 is formed.

The passivation film 43 is subsequently dry-etched through the resist pattern 44 serving as a mask with an etching gas such as $SF_6/CHF_3$ gas until the surface of the AlGaN layer 41 is exposed. The passivation film 43 is etched at a rate of, for example, about 0.24 μm/min.

Referring to FIG. 23A, the AlGaN layer 41 is subsequently etched to form a JTE structure 40. Specifically, the AlGaN layer 41 is completely dry-etched through the resist pattern 44 serving as a mask with an etching gas such as a chlorine-based gas. The AlGaN layer 41 is etched at a rate of, for example, about 10 nm/min. In this dry-etching, since the thickness of the AlGaN layer 41 in the floating-electrode-forming region is about 5 nm, a portion of the surface layer of the n-GaN layer 2 in this region is etched.

Thus, the JTE structure 40 whose surface is covered by the passivation film 43 is formed. The JTE structure 40 includes the thick-film portions 41A to 41F whose width decreases stepwise with increasing distance from the anode-forming region.

The resist pattern 44 is removed by, for example, ashing with oxygen plasma.

Referring to FIG. 23B, the anode 7 and a floating electrode 45 are subsequently formed. Specifically, resist is applied to the n-GaN layer 2 so as to cover the JTE structure 40 and the passivation film 43 and the applied resist is patterned by lithography. As a result, a resist pattern is formed that has an opening through which the anode-forming region and a region of the passivation film 43 around the anode-forming region are exposed and an opening through which the floating-electrode-forming region is exposed. As with the former opening, the latter opening may be formed such that the floating-electrode-forming region and a region of the passivation film 43 around the floating-electrode-forming region are exposed through the opening.

Electrode materials (for example, Ni and Au) are subsequently deposited onto the resist pattern so as to fill the openings by, for example, vacuum deposition such that a Ni film having a thickness of about 100 nm and a Au film having a thickness of about 300 nm are formed.

The resist pattern together with the electrode materials thereon are removed by a liftoff process. Thus, the anode 7 is formed so as to fill the anode-forming region and overhang the region of the passivation film 43 around the anode-forming region by, for example, about 2 μm; and the floating electrode 45 is formed so as to fill the floating-electrode-forming region and project above the passivation film 43. As with the anode 7, the floating electrode 45 may be formed so as to fill the floating-electrode-forming region and overhang a region of the passivation film 43 around the floating-electrode-forming region.

The anode 7 is in contact with the n-GaN layer 2 at the bottom thereof and also in contact with the JTE structure 40 in the side surface thereof. The floating electrode 45 is formed so as to have the shape of a frame surrounding the JTE structure 40. The floating electrode 45 is in contact with the n-GaN layer 2 at the bottom thereof and also in contact with the JTE structure 40 in the side surface thereof. Unlike the anode 7, the surface of the floating electrode 45 is not connected to, for example, a lead, and the floating electrode 45 is electrically floated.

In the third embodiment, a case where the anode 7 and the floating electrode 45 are formed is described as an example. However, the formation of the floating electrode 45 may be eliminated.

Figure 24:
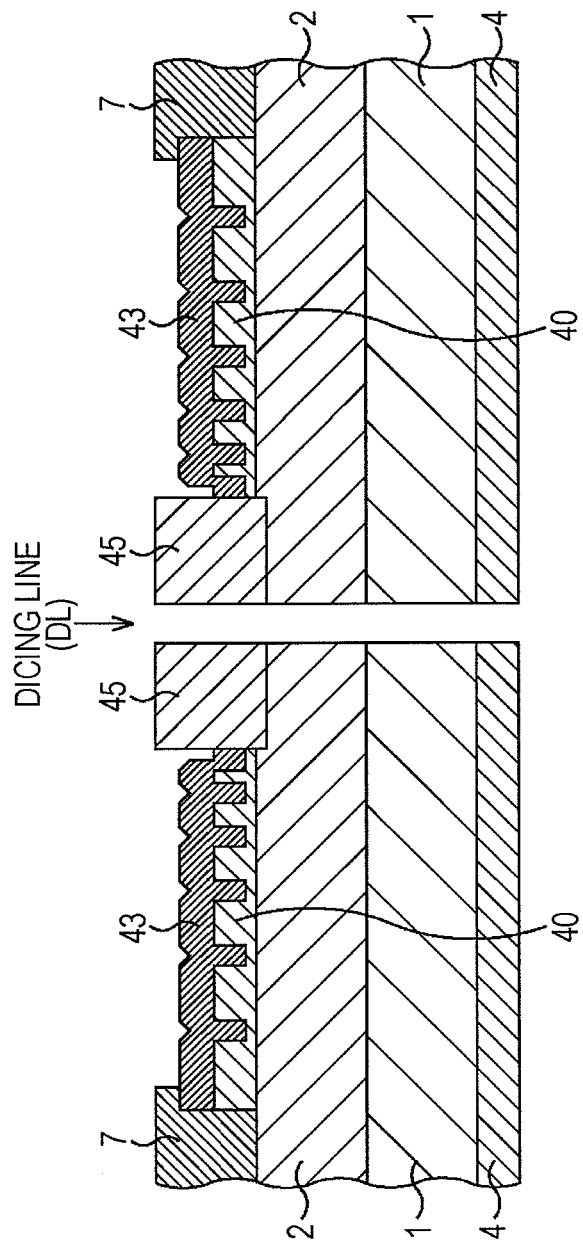
FIG. 24 is a schematic sectional view illustrating a step (subsequent to the step in FIG. 23B) of a method for producing a SBD according to the third embodiment.

Referring to FIG. 24, the n-GaN substrate 1 is subsequently divided along a dicing line (DL) into chips. Thus, SBDs according to the third embodiment are formed.

Figure 25:
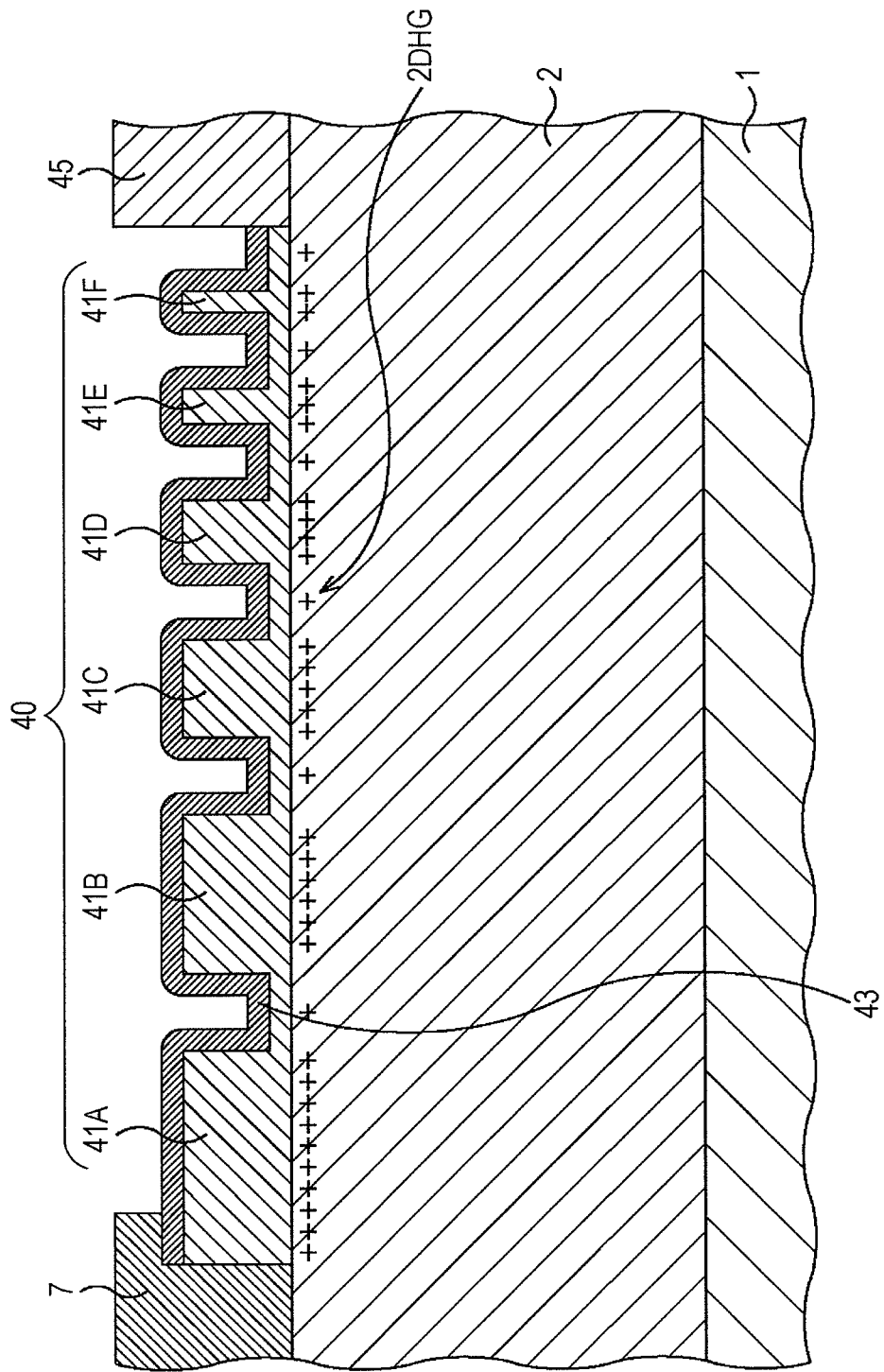
FIG. 25 is a schematic sectional view illustrating generation of 2DHG in a SBD according to the third embodiment.

Referring to FIG. 25 (where the cathode 4 is abbreviated), in the third embodiment, the JTE structure 40 is constituted by an AlGaN layer including the thick-film portions 41A to 41F whose width decreases stepwise with increasing distance from the anode 7. In this configuration, 2DHG is induced in a region of the n-GaN layer 2, the region being located at the interface between the n-GaN layer 2 and the JTE structure 40, by fixed charge due to polarization. The hole concentration of the 2DHG decreases with decreasing width of the portions of the JTE structure 40, that is, with increasing distance from the anode 7. By generating 2DHG such that the hole concentration thereof decreases stepwise with increasing distance from the anode 7, electric field concentration may be gradually reduced.

As described above, according to the third embodiment, highly reliable SBDs may be achieved in which the intended concentration distribution of 2DHG is readily and reliably achieved without ion implantation and electric field concentration is gradually reduced. In addition, in the third embodiment, the thick-film portions 41A to 41F may be formed by one-time patterning of the AlGaN layer 41 to thereby increase the production yield.

The first modification in the first embodiment may also be applied to the third embodiment.

In such a case, an n-GaN layer (having a Ga-face surface) and an InGaN layer are formed on the Ga face of the n-GaN substrate 1. The InGaN layer is processed by the steps illustrated in FIGS. 21C and 22A so as to include thick-film portions whose width decreases stepwise with increasing distance from the anode-forming region. The InGaN layer is dry-etched together with the passivation film 43. Thus, a JTE structure constituted by the InGaN layer including the thick-film portions whose width decreases stepwise with increasing distance from the anode 7 is formed.

The JTE structures of the first to third embodiments and the modifications may be applied to SBDs as well as other compound semiconductor devices such as a U-shape metal-oxide-semiconductor field-effect-transistor (UMOSFET).

In such a UMOSFET, when the JTE structure is formed of AlGaN, the JTE structure is preferably formed on a drift layer, for example, an n-GaN drift layer having an N-face surface.

In this UMOSFET, 2DHG is generated in a region of the n-GaN drift layer, the region being located at the interface between the n-GaN drift layer and the JTE structure. This 2DHG is generated under and along the JTE structure and the hole concentration of the 2DHG decreases stepwise with increasing distance from the electrode end. By generating 2DHG having such a hole concentration distribution, electric field concentration may be gradually reduced. Accordingly, a highly reliable UMOSFET may be achieved in which the intended concentration distribution of 2DHG is readily and reliably achieved without ion implantation and electric field concentration is gradually reduced.

The SBD chips according to the first to third embodiments and the modifications and the UMOSFET chip are applied to "discrete components".

The discrete components include the SBD chips according to the first to third embodiments and the modifications and the UMOSFET chip. Hereinafter, one of the discrete components including the SBD chips according to the first to third embodiments and the modifications (hereafter, referred to as a SBD chip 51) will be described as an example.

Figure 26:
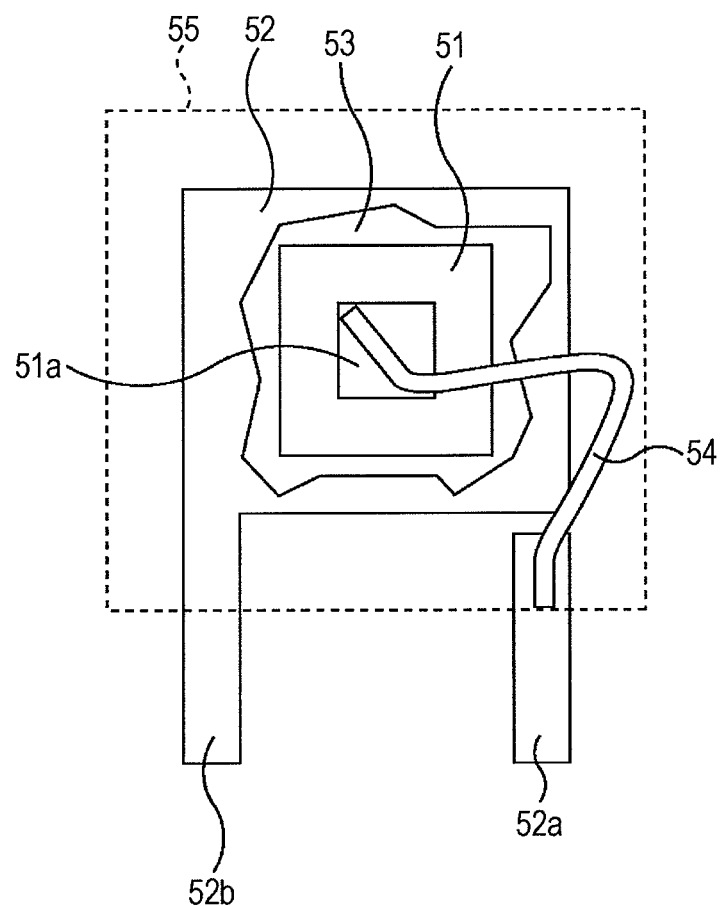
FIG. 26 is a schematic plan view of a discrete component.

FIG. 26 is a schematic plan view of the discrete component. An electrode pad 51a is formed on a surface of the SBD chip 51. The electrode pad 51a is electrically connected to the anode of the SBD chip 51.

The discrete component is produced in the following manner. The SBD chip 51 is first fixed on a leadframe 52 with a die-attaching agent 53 such as solder.

The electrode pad 51a is electrically connected to an anode lead 52a by bonding through an Al wire 54. A cathode formed on the back surface of the substrate is brought into conduction with the leadframe 52 by fixing the SBD chip 51 on the leadframe 52; and a cathode lead 52b serves as a lead electrode.

The SBD chip 51 is sealed with a molding resin 55 by transfer molding and the leadframe 52 is separated. Thus, the discrete component is formed.

The SBDs according to the first to third embodiments and the modifications and the UMOSFET are applied to, for example, power factor correction (PFC) circuits.

Figure 27:
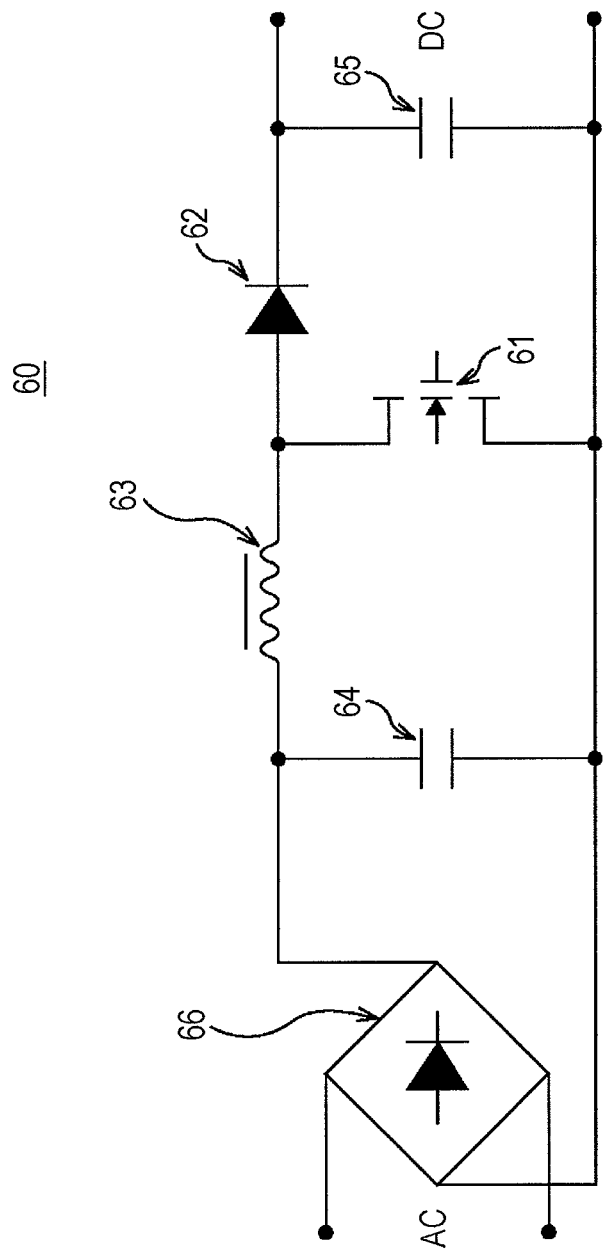
FIG. 27 is a connecting diagram of a PFC circuit.

FIG. 27 is a connecting diagram of a PFC circuit. A PFC circuit 60 includes a switching element (transistor) 61, a diode 62, a choke coil 63, capacitors 64 and 65, and a diode bridge 66. One of the SBDs according to the first to third embodiments and the modifications is applied to the diode 62. The above-described UMOSFET may be applied to the switching element 61. It is also preferable that one of the SBDs according to the first to third embodiments and the modifications be applied to the diode 62 and the above-described UMOSFET be applied to the switching element 61.

In the PFC circuit 60, the drain electrode of the switching element 61 is connected to the anode terminal of the diode 62 and a terminal of the choke coil 63. The source electrode of the switching element 61 is connected to a terminal of the capacitor 64 and a terminal of the capacitor 65. The other terminal of the capacitor 64 is connected to the other terminal of the choke coil 63. The other terminal of the capacitor 65 is connected to the cathode terminal of the diode 62. An alternating-current power supply (AC) is connected between the terminals of the capacitor 64 via the diode bridge 66. A direct-current power supply (DC) is connected between the terminals of the capacitor 65.

Figure 28:
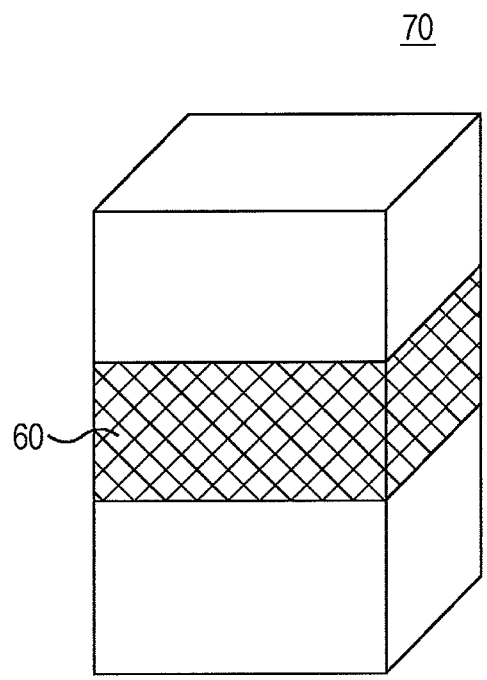
FIG. 28 is a schematic view of a server power supply.

Referring to FIG. 28, the PFC circuit 60 is incorporated into, for example, a server power supply 70. The server power supply includes a first block that converts AC input into DC, a second block that increases the power factor of the first block, and a third block that converts DC distributed to substrates into voltages suitable for circuit blocks. In the server power supply 70, the PFC circuit 60 is applied to the second block. As in the server power supply 70, use of the PFC circuit 60 allows for another highly reliable power supply.

Thus, application of the SBDs according to the first to third embodiments and the modifications and/or the UMOSFET to PFC circuits allows for highly reliable power supplies suitable for high-breakdown-voltage applications.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments) of the present inventions have been described in detail, it should be understood that the various changes, substitutions, and alterations could be made hereto without departing from the spirit and scope of the invention.

What is claimed is:

1. A compound semiconductor device comprising:
   a substrate;
   a first compound semiconductor layer formed over the substrate;
   a second compound semiconductor layer formed over the first compound semiconductor layer; and
   an upper electrode formed over the first compound semiconductor layer,
   wherein two-dimensional hole gas is generated in a region of the first compound semiconductor layer, the region being located at an interface between the first compound semiconductor layer and the second compound semiconductor layer, so as to have a hole concentration that decreases with increasing distance along a direction parallel to the substrate from the upper electrode.

2. The compound semiconductor device according to claim 1, wherein the second compound semiconductor layer has a stepped structure in which a thickness of the second compound semiconductor layer decreases stepwise with increasing distance from the upper electrode.

3. The compound semiconductor device according to claim 1, wherein the second compound semiconductor layer is composed of a compound semiconductor containing aluminum or indium, and a content of aluminum or indium of the second compound semiconductor layer decreases with increasing distance from the upper electrode.

4. The compound semiconductor device according to claim 1, wherein the second compound semiconductor layer includes a plurality of thick-film portions separated by a plurality of grooves, and a width of the plurality of thick-film portions decreases stepwise with increasing distance from the upper electrode.

5. The compound semiconductor device according to claim 1,
   wherein the first compound semiconductor layer is composed of a gallium nitride-based semiconductor, and
   the second compound semiconductor layer is composed of one semiconductor selected from a gallium nitride-based semiconductor containing aluminum, a gallium nitride-based semiconductor containing indium, and a gallium nitride-based semiconductor containing aluminum and indium.

6. The compound semiconductor device according to claim 1, further comprising:
   a lower electrode formed on a back surface of the substrate.

7. A method for producing a compound semiconductor device, comprising:
   forming a first compound semiconductor layer over a substrate;

forming a second compound semiconductor layer over the first compound semiconductor layer; and forming an upper electrode over the first compound semiconductor layer, wherein two-dimensional hole gas is generated in a region of the first compound semiconductor layer, the region being located at an interface between the first compound semiconductor layer and the second compound semiconductor layer, so as to have a hole concentration that decreases with increasing distance along a direction parallel to the substrate from the upper electrode.

8. The method according to claim 7, wherein the second compound semiconductor layer is formed so as to have a stepped structure in which a thickness of the second compound semiconductor layer decreases stepwise with increasing distance from the upper electrode.

9. The method according to claim 7, wherein the second compound semiconductor layer is composed of a compound semiconductor containing aluminum or indium, and a content of aluminum or indium of the second compound semiconductor layer decreases with increasing distance from the upper electrode.

10. The method according to claim 9, wherein the forming the second compound semiconductor layer includes forming a mask having an opening for an area where the second compound semiconductor layer is to be formed, and by molecular beam epitaxy, making aluminum or indium incident at a first angle tilted away from the upper electrode with reference to a line normal to the substrate, and making another material element incident at a second angle tilted toward the upper electrode with reference to the normal line, and the second angle is larger than the first angle.

11. The method according to claim 7, wherein a plurality of grooves are formed in the second compound semiconductor layer such that the second compound semiconductor layer includes a plurality of thick-film portions separated by the plurality of grooves, and a width of the plurality of thick-film portions decreases stepwise with increasing distance from the upper electrode.

12. The method according to claim 7, wherein the first compound semiconductor layer is composed of a gallium nitride-based semiconductor, and the second compound semiconductor layer is composed of one semiconductor selected from a gallium nitride-based semiconductor containing aluminum, a gallium nitride-based semiconductor containing indium, and a gallium nitride-based semiconductor containing aluminum and indium.

13. The method according to claim 7, further comprising:

forming a lower electrode on a back surface of the substrate.

14. A power supply comprising a Power Factor Correction circuit including a diode and a switching element, at least one of the diode and the switching element is a compound semiconductor device, the compound semiconductor device including a substrate, a first compound semiconductor layer formed over the substrate, a second compound semiconductor layer formed aver the first compound semiconductor layer, and an upper electrode formed over the first compound semiconductor layer, wherein two-dimensional hole gas is generated in a region of the first compound semiconductor layer, the region being located at an interface between the first compound semiconductor layer and the second compound semiconductor layer, so as to have a hole concentration that decreases with increasing distance from the upper electrode.

* * * * *